(12) United States Patent
Campet et al.

(10) Patent No.: US 9,120,708 B2
(45) Date of Patent: Sep. 1, 2015

(54) PROCESS FOR PREPARING CERAMICS, CERAMICS THUS OBTAINED AND USES THEREOF, ESPECIALLY AS A SPUTTERING TARGET

(75) Inventors: Guy Campet, Canéjan (FR); Iyad Saadeddin, Naplouse (PK); Karim Zaghib, Longueuil (CA)

(73) Assignees: HYDRO-QUEBEC, Montreal, Quebec (CA); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 1351 days.

(21) Appl. No.: 12/301,430

(22) PCT Filed: May 17, 2007

(86) PCT No.: PCT/CA2007/000881
§ 371 (c)(1),
(2), (4) Date: Jun. 20, 2009

(87) PCT Pub. No.: WO2007/134439
PCT Pub. Date: Nov. 29, 2007

(65) Prior Publication Data
US 2009/0315001 A1    Dec. 24, 2009

(30) Foreign Application Priority Data

May 18, 2006 (CA) .................................... 2547091
Jul. 24, 2006 (CA) .................................... 2553146

(51) Int. Cl.
*H01B 1/08* (2006.01)
*C04B 35/453* (2006.01)
(Continued)

(52) U.S. Cl.
CPC ........... *C04B 35/6261* (2013.01); *C04B 35/453* (2013.01); *C04B 35/457* (2013.01);
(Continued)

(58) Field of Classification Search
USPC .............................. 252/518.1, 519.51, 520.21
See application file for complete search history.

(56) References Cited

U.S. PATENT DOCUMENTS

| 4,647,548 A | 3/1987 | Klein |
| 5,071,800 A | 12/1991 | Iwamoto et al. |
| 6,187,253 B1 | 2/2001 | Schlott et al. |

FOREIGN PATENT DOCUMENTS

| JP | 10-237632 A | 9/1998 |
| JP | 2000-185968 A | 7/2000 |

(Continued)

OTHER PUBLICATIONS

Ali et al., "Characterization of a new Transparent-Conducting Material of ZnO Doped ITO Thin Films" Phys. Stat. Sol., 2005, (a) vol. 202, No. 14, pp. 2742-2752.

(Continued)

*Primary Examiner* — Ling Choi
*Assistant Examiner* — Thuy-Ai Nguyen
(74) *Attorney, Agent, or Firm* — Buchanan Ingersoll & Rooney P.C.

(57) ABSTRACT

Process for preparing a ceramic from an inorganic base material that is in the form of a powder having a high melting point, comprising a step of mixing the powder of the inorganic base material with a second inorganic component also in powder form and which acts as a dopant for the inorganic base material. The dopant is constituted by a single inorganic material or by a mixture of at least two inorganic materials having a dopant effect on the inorganic base material. The process comprises a sintering step carried out at a high temperature. The ceramics obtained, because of their high density, are advantageously used as a target element. Films and electrodes obtained from these ceramics exhibit particularly advantageous properties.

15 Claims, 18 Drawing Sheets

(51) Int. Cl.
 C04B 35/626 (2006.01)
 C04B 35/457 (2006.01)
 C04B 35/462 (2006.01)
 C23C 14/34 (2006.01)

(52) U.S. Cl.
 CPC ........... *C04B35/462* (2013.01); *C04B 35/6264* (2013.01); *C23C 14/3414* (2013.01); C04B 2235/3203 (2013.01); C04B 2235/3206 (2013.01); C04B 2235/3284 (2013.01); C04B 2235/3286 (2013.01); C04B 2235/3293 (2013.01); C04B 2235/6562 (2013.01); C04B 2235/6565 (2013.01); C04B 2235/6567 (2013.01); C04B 2235/76 (2013.01); C04B 2235/761 (2013.01); C04B 2235/77 (2013.01)

(56) References Cited

FOREIGN PATENT DOCUMENTS

| JP | 2002-179469 A | 6/2002 |
| WO | WO 93/12264 A1 | 6/1993 |

OTHER PUBLICATIONS

Ambrosini et al., "Variable-Temperature Electrical Measurements of Zinc Oxide/Tin Oxide-Cosubstituted Indium Oxide" Chem. Mater., 2002, vol. 14, pp. 52-57.
Burstein et al., "Infrared Photoconductivity Due to Neutral Impurities in Germanium" Physical Review, 1954, vol. 93, No. 1, pp. 65-68.
De Wit, "Structural Aspects and Defect Chemistry in $In_2O_3$," Journal of Solid State Chemistry, 1977, vol. 20, pp. 143-148.
Enoki et al., "The Intermediate Compound in the $In_2O_3$—$SnO_2$ System" Journal of Materials Science, 1991, vol. 26, pp. 4110-4115.
Fan et al., "X-Ray Photoemission Spectroscopy Studies of Sn-Doped Indium—Oxide Films" Journal of Applied Physics, 1977, vol. 48, No. 8, pp. 3524-3531.
Fortunato et al., "High Mobility Amorphous/Nanocrystalline Indium Zinc Oxide Deposited at room Temperature" Thin Solid Films, 2006, vol. 502, pp. 104-107.
Freeman et al., "Chemical and Thin-Film Strategies for New Transparent Conducting Oxides" MRS Bulletin, 2000, vol. 25, pp. 45-51.
Granqvist, "Solar Energy Materials" Applied Physics A, 1991, vol. 52, pp. 83-93.
Granqvist et al., "Transparent and Conducting ITO Films: New Developments and Applications" Thin Solid Films, 2002, vol. 411, pp. 1-5.
Hamberg et al., "Evaporated Sn-Doped $In_2O_3$ Films: Basic Optical Properties and Applications to Energy-Efficient Windows" Journal of Applied Physics, 1986, vol. 60, No. 11, pp. R123-R159.
Ito et al., "Electrical and Optical Properties of Amorphous Indium Zinc Oxide Films" Thin Solid Films, 2006, vol. 496, pp. 99-103.
Jung et al., "Influence of DC Magnetron Sputtering Parameters on the Properties of Amorphous Indium Zinc Oxide Thin Film" Thin Solid Films, 2003, vol. 445, pp. 63-71.
Kiliç et al., "Origins of Coexistence of Conductivity and Transparency in $SnO_2$" Physical Review Letters, 2002, vol. 88, No. 9, pp. 095501-1-095501-4.
Kim et al., "Electrical, Optical, and Structural Properties of Indium—Tin—Oxide Thin Films for Organic Light-Emitting Device" Journal of Applied Physics, 1999, vol. 86, No. 11, pp. 6451-6461.
Kim et al., "Indium Tin Oxide Thin Films for Organic Light-Emitting Devices" Applied Physics Letters, 1999, vol. 74, No. 23, pp. 3444-3446.
Ku et al., "Structural and Electrical Properties of Sputtered Indium—Zinc Oxide Thin Films" Thin Solid Films, 2006, vol. 515, pp. 1364-1369.
Lewis et al., "Application and Processing of Transparent Conducting Oxides" MRS Bulletin, 2000, vol. 25, pp. 22-27.
Marcel, "These", Bordeaux 1 University, Bordeaux, France, 1998, 179 pages.
Marezio, "Refinement of the Crystal Structure of $In_2O_3$ at two Wavelengths" Acta Cryst., 1966, vol. 20, pp. 723-728.
Mason et al., "Point Defects and Related Properties of Highly Co-Doped Bixbyite $In_2O_3$" Phys. Chem. Chem. Phys., 2003, vol. 5, pp. 2183-2189.
Minami et al., "Transparent Conducting Zinc—Co-Doped ITO Films Prepared by Magnetron Sputtering" Thin Solid Films, 2000, vol. 373, pp. 189-194.
Minami et al., "New Transparent Conducting ZnO—$In_2O_3$—$SnO_2$ Thin Films Prepared by Magnetron Sputtering" Thin Solid Films, 1998, vol. 317, pp. 318-321.
Minami et al., "Preparation of Transparent and Conductive $In_2O_3$—ZnO Films by Radio Frequency Magnetron Sputtering" J. Vac. Sci. Technol. A, 1996, vol. 14, No. 3, pp. 1704-1708.
Minami et al., "Highly Transparent and Conductive ZnO—$In_2O_3$ Thin Films Prepared by D.C. Magnetron Sputtering" Thin Solid Films, 1996, vol. 290-291, pp. 1-5.
Moriga et al., "Phase Relationships and Physical Properties of Homologous Compounds in the Zinc Oxide—Indium Oxide System" Journal of the American Ceramic Society, 1998, vol. 81, No. 5, pp. 1310-1316.
Moss, "The Interpretation of the Properties of Indium Antimonide" Proc. Phys. Soc. London Sect. B, 1954, vol. 67, pp. 775-782.
Naghavi et al., "Systematic Study and Performance Optimization of Transparent Conducting Indium—Zinc Oxides Thin Films" Electrochimica Acta, 2001, vol. 46, pp. 2007-2013.
Naghavi et al., "Characterization of Indium Zinc Oxide Thin Films Prepared by Pulsed Laser Deposition Using a $Zn_3IN_2O_6$ Target" Thin Solid Films, 2000, vol. 360, pp. 233-240.
Naghavi et al., "Influence of Tin Doping on the Structural and Physical Properties of Indium—Zinc Oxides Thin Films Deposited by Pulsed Laser Deposition" Thin Solid Films, 2002, vol. 419, pp. 160-165.
Naghavi et al., "Structural and Physical Characterisation of Transparent Conducting Pulsed Laser Deposited $In_2O_3$—ZnO Thin Films" J. Mater. Chem., 2000, vol. 10, pp. 2315-2319.
Nomura et al., "Thin-Film Transistor Fabricated in Single-Crystalline Transparent Oxide Semiconductor" Science, 2003, vol. 300, pp. 1269-1272.
Palmer et al., "Conductivity and Transparency of $ZnO/SnO_2$-Cosubstituted $In_2O_3$" Chem. Mater., 1997, vol. 9, pp. 3121-3126.
Phillips et al., "Zinc—Indium—Oxide: A High Conductivity Transparent Conducting Oxide" Appl. Phys. Lett., 1995, vol. 67, No. 15, pp. 2246-2248.
Russak et al., "Radio-Frequency Sputtered Indium Tin Oxide Thin Films" J. Vac. Sci. Technol., 1983, vol. 1, pp. 1563-1564.
Saadeddin et al., "Simultaneous Doping of Zn and Sb in $SnO_2$ Ceramics: Enhancement of Electrical Conductivity" Solid State Sciences, 2006, vol. 8, pp. 7-13.
Sasabayashi et al., "Comparative Study on Structure and Internal Stress in Tin-Doped Indium Oxide and Indium—zinc Oxide Films Deposited by R.F. Magnetron Sputtering" Thin Solid Films, 2003, vol. 445, pp. 219-223.
Shannon, Revised Effective Ionic Radii and Systematic Studies of Interatomic Distances in Halides and Chalcogenides Acta Cryst, 1976, vol. A32, pp. 751-767.
Wang et al., "Highly Conducing Transparent Thin Films based on Zinc Oxide" J. Mater. Res., 1996, vol. 11, No. 7, pp. 1659-1664.
Yaglioglu et al., "A Study of Amorphous and Crystalline Phases in $In_2O_3$-10 wt.% ZnO Thin Films Deposited by DC Magnetron Sputtering" Thin Solid Films, 2006, vol. 496, pp. 89-94.
Form PCT/ISA/210 (International Search Report) dated Sep. 11, 2007.
A. Ambrosini et al., "Zinc Doping in Cosubstituted $In_{2-2x}Sn_xZn_xO_{-\delta}$", Chem. Mater., 2002, vol. 14, pp. 58-63, American Chemical Society (cited in the International Search Report and on p. 5 of the specification).
Dong-Hyuk Park, et al., "Effect of ZnO Addition in $In_2O_3$ Ceramics: Defect Chemistry and Sintering Behavior", Solid State Ionics, 2004, vol. 172, pp. 431-434 (cited in the International Search Report and on p. 7 of the specification).

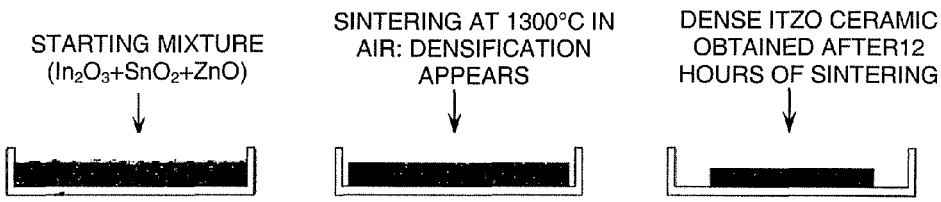
FIG 1A — STARTING MIXTURE (In$_2$O$_3$+SnO$_2$+ZnO)
FIG 1B — SINTERING AT 1300°C IN AIR: DENSIFICATION APPEARS
FIG 1C — DENSE ITZO CERAMIC OBTAINED AFTER 12 HOURS OF SINTERING
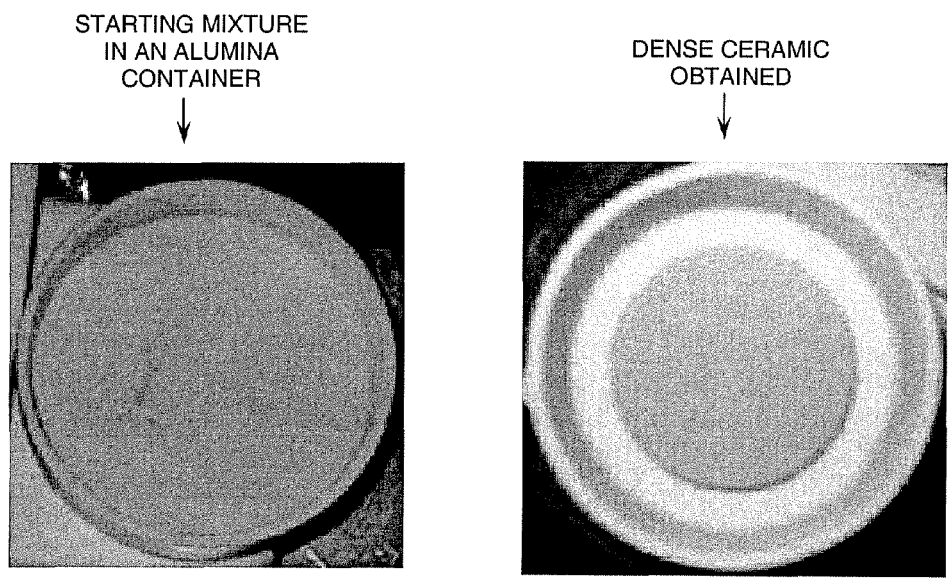
FIG 1D — STARTING MIXTURE IN AN ALUMINA CONTAINER
FIG 1E — DENSE CERAMIC OBTAINED

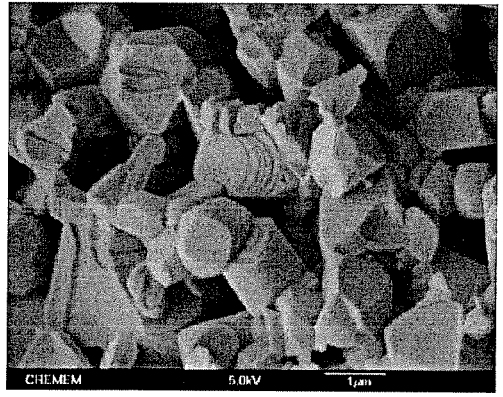 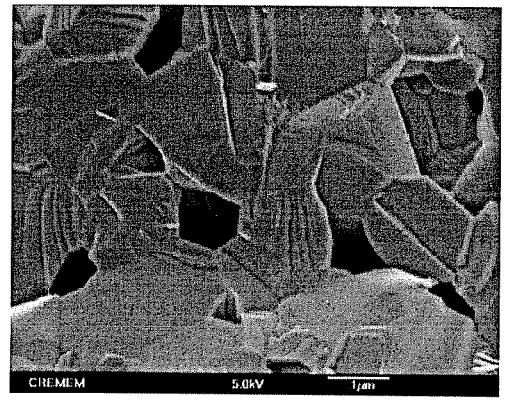
FIG 2A  FIG 2B
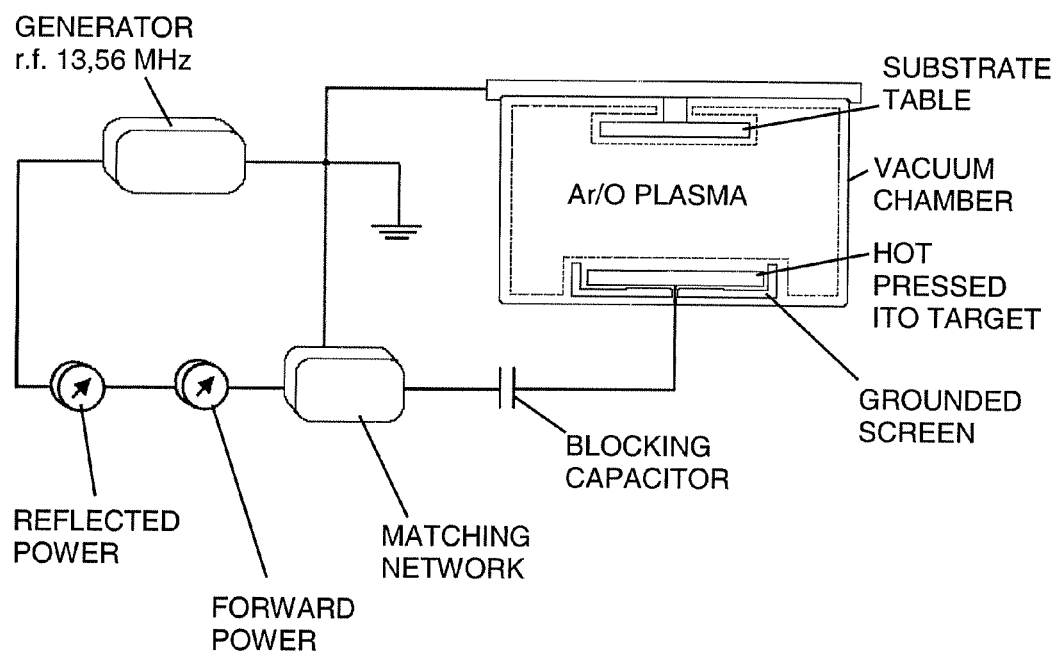
FIG 3

Lightly pressed starting mixture
($In_2O_3$ + $SnO_2$ + ZnO)

Resulting dense ITZO ceramic
after sintering for 12 hours

← Alumina crucible →

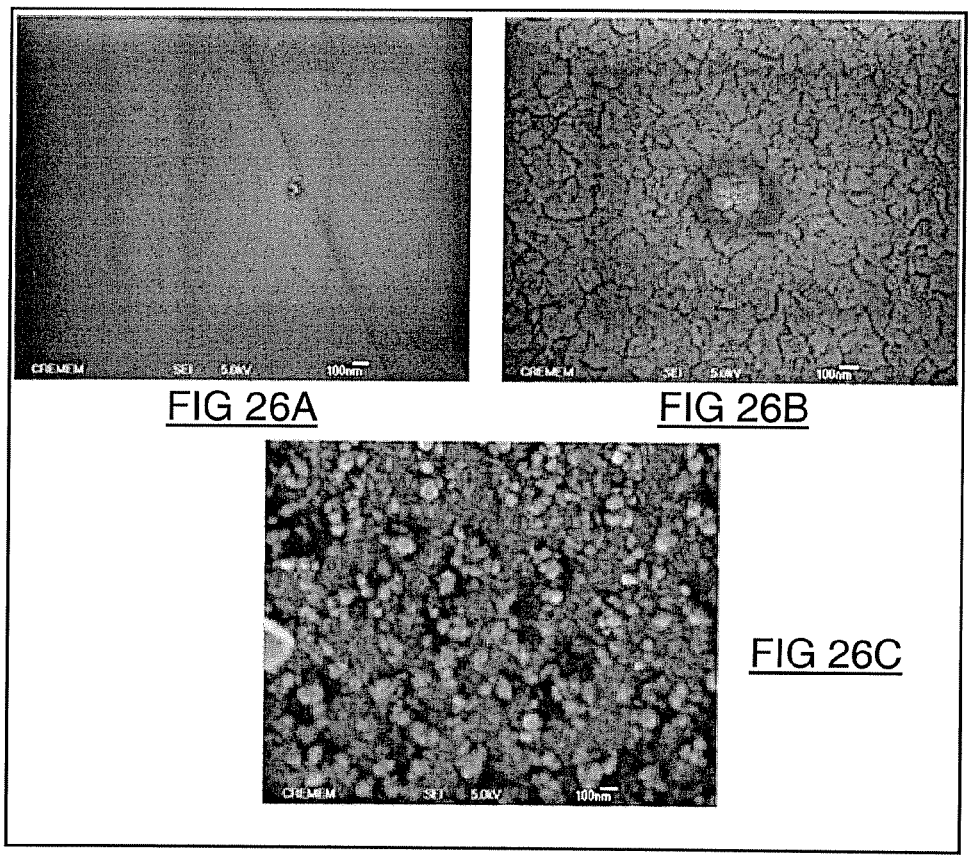
FIG 26A   FIG 26B
FIG 26C
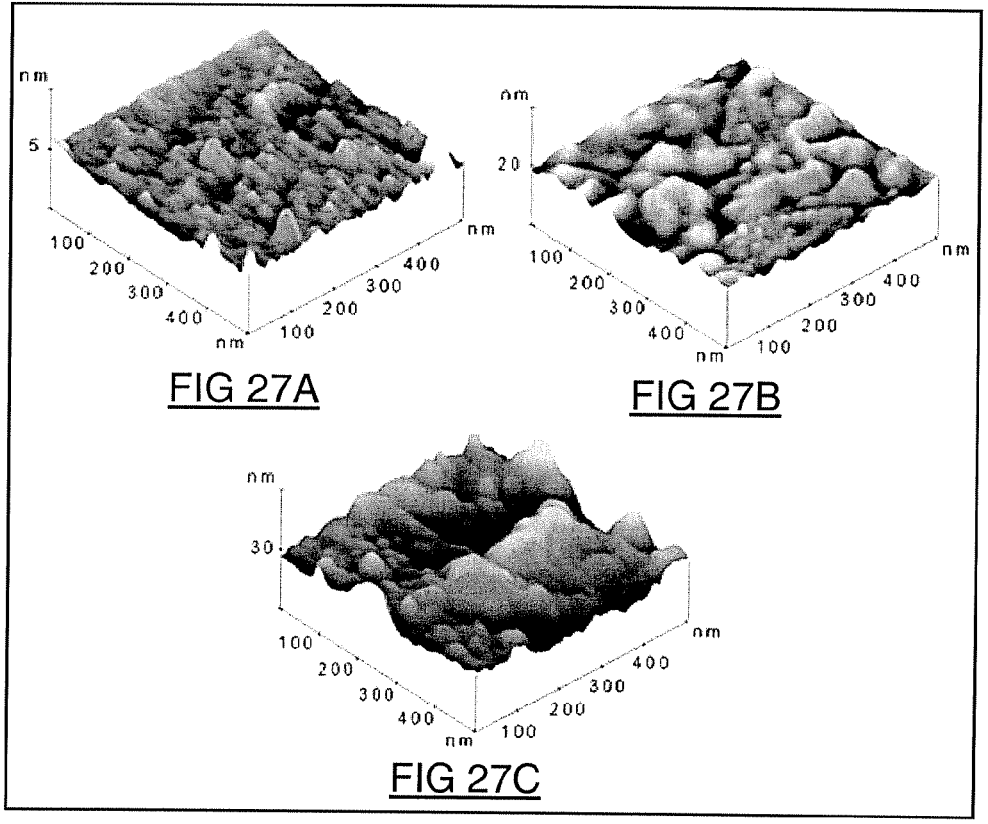
FIG 27A   FIG 27B
FIG 27C

PROCESS FOR PREPARING CERAMICS, CERAMICS THUS OBTAINED AND USES THEREOF, ESPECIALLY AS A SPUTTERING TARGET

FIELD OF THE INVENTION

The invention relates to a process for preparing ceramics, especially high-density ceramics.

The invention also relates to ceramics and target elements obtained by implementing processes of the invention. These ceramics and target elements are characterized by remarkable mechanical properties, especially by a high apparent density close to the theoretical density.

Furthermore, the present invention relates to the uses of these ceramics and target elements, especially the implementation of processes that allow the production of films as thin films by sputtering from the targets, and of electrodes for electrochemical devices (microgenerators, electrochromic devices, gas sensors, etc.).

The films and electrodes thus obtained, especially those obtained as thin films which have particularly advantageous properties, also constitute one aspect of the present invention.

PRIOR ART

In recent years, the coating of various materials with thin films having particular properties has been the subject of considerable development. As an example of the use of this technology, mention may traditionally be made of the deposition of ultrahard materials onto mechanical parts, of transparent electrodes having metallic-type conductivity for optoelectronic devices, of electrodes for electrochromic devices, of electrodes for microbatteries, the deposition of anticorrosive layers onto metals and of antireflection layers onto optical glass.

The numerous methods that can be used for producing such layers differ substantially depending on the chemical identity of the coating-layer-generating compound or compounds.

Chemical vapor deposition methods, whether plasma-enhanced or not, are suitable in the context of gaseous-type generating compounds.

In the case of generating compounds that are liquid or are capable of being put into solution, use is generally made of the method which consists in depositing a layer of a metal, or else methods of the spin-coating type or for deposition by spraying a hot mist.

When the generating source of the coating is a material of solid type, use is advantageously made of RF or DC type sputtering as described, in particular, in "http://pages-perso.lapost-e.net/librebel/download3/pulve.pdf" and in "Study of Indium Tin Oxide (ITO) for Novel Optoelectronic Devices" by Shabbir A. Bashar B. Eng., submitted in accordance with the requirement for the Degree of Doctor of Philosophy KING'S COLLEGE LONDON, University of London, Department of Electronic Engineering 1998.

The solid material that generates the coating, customarily termed "target material" or "target", may be constituted by a metal, by a metal alloy or else by an inorganic chemical compound having a particularly high melting point. In this context, a ceramic constituted of a refractory oxide is bombarded using a source of ions that have sufficient energy to detach particles of the target material. The particles thus detached are deposited (by transfer of material) onto the object to be coated.

The distance between the emitter of particles, that is to say the target, and the receiver, that is to say the substrate on which the particles that have the kinetic energy required to give the film are deposited, generally varies between around 4 and 15 cm. Provided that the surface of the target material to be deposited onto the object is of sufficient size, an adequate growth rate and homogeneity are then obtained for the deposition formed from particles detached from the target material.

The manufacture of targets of large surface area from metals or metal alloys is relatively easy to carry out by passing through the intermediate step of preparing a ceramic. In the case of preparing such targets from inorganic chemical compounds having a high melting point, the operation proves tricky due to the difficulties that there are in first producing a ceramic that has the required characteristics. For each new inorganic material used for the purpose of producing a ceramic, it is necessary to work out the parameters of the process. This is an operation which may prove random, long and complex and which results in high operating costs, in particular when a technique involving high pressures is used. Such methods are too tricky to be put into production by a simple operator, the involvement of an expert proves indispensible.

Conventionally, two sintering techniques are mainly used for manufacturing ceramics (targets) intended to be used in the context of a sputtering.

The first process is qualified as "natural" sintering from a target which is prepared as follows:
  (i) compacting step: the powder of the inorganic material is first compacted at ambient temperature in a suitable mold, that withstands high pressures, of the order of 1 tonne/cm$^2$. Additives, such as camphor, may be added to facilitate the compacting and, therefore, the demolding of the thus compacted powder before it is sintered at temperature; and
  (ii) sintering step: for compacted elements of large surface area ($\geq 100$ cm$^2$), technical difficulties (besides "the encumbrance" of the mold which is also costly) are however encountered for removing the compacted element from the mold without deteriorating it and conveying it without damage into the furnace in order to be sintered therein to give the final ceramic.

This process which thus comprises two steps (i) and (ii) proves tricky to implement, particularly in the second step and for targets of large surface area.

For these reasons, industrialists generally use a second process, commonly known as hot pressing (HP). This is a hot compacting of the powder of the inorganic material in a suitable, chemically inert mold that withstands high pressures and temperatures.

Although the second method makes it possible to obtain ceramics of good quality (homogeneous, dense) in a single step, this manufacturing process has the drawback of requiring the use of heavy-duty and very expensive equipment, especially for targets of large surface area.

The process of using a ceramic as a target for sputtering is described in "Study of Indium Tin Oxide (ITO) for Novel Optoelectronic Devices" by Shabbir B. Bashar B. Eng., submitted in accordance with the requirement for the Degree of Doctor of Philosophy KING'S COLLEGE LONDON, University of London, Department of Electronic Engineering, 1998.

Sputtering is a phenomenon of ejecting particles from the surface of a material, when the latter is bombarded by a stream of energetic particles. The conventional diagram for diode sputtering is presented in FIG. 3.

The particles, generally argon ions Ar$^+$ of the plasma, are accelerated in the electric field of the target, borne at a negative voltage relative to that of the plasma. The sputtered particles are in general neutral. They are diffused throughout the chamber. A certain number of them are recovered on a carrier known as a substrate, placed opposite the target, and on which they form a thin film. The plasma, also known as glow discharge, is the base of the sputtering.

The publication entitled "Zinc Doping in Cosubstituted $In_{2-2x}Sn_xZn_xO_{3-\delta}$" by A. Ambrosini, in Chem. Mater. 2002, 14, 58-63, mentions a cosubstituted solid solution $In_{2-2x}Sn_xZn_xO_{3-\delta}$ acceptor-doped with $Zn^{2+}$ to form $In_{2-x-y}Sn_xZn_yO_{3-\delta}$ (y>x). A 4% $Zn^{2+}$ excess can be introduced in $In_{1.6}Zn_{0.2}O_{3-\delta}$ while maintaining the bixbyite structure. The n-type conductivity of the doped material decreases with zinc substitution. Zn-doped $In_{1.6}Sn_{0.2}Zn_{0.2}O_{3-\delta}$ was annealed under high oxygen pressure (170 atm) to eliminate anion vacancies, $V_{o''}$. Owing to a decrease in carrier concentration by up to 2 orders of magnitude from $10^{20}$ to $10^{18}$ carriers/cm$^3$, the conductivity of the annealed material decreases. Hall measurements show that the carriers remain as n-type. The results imply the existence of neutral Zn—$V_{o''}$ complexes that prevent the donation of holes by $Zn^{2+}$.

The process described in this publication relates to a method of preparing ceramics which comprises a first pressing carried out at ambient temperature, at a very high pressure of 7-8 MPa per cm$^2$. This method makes it possible to obtain ceramics having densities close to the theoretical density, but has the drawback of being complex (at least two pressing steps) and of requiring a very large energy input.

The publication by I. Saadeddin et al., entitled "Simultaneous doping of Zn and Sb in $SnO_2$ ceramics: enhancement of electrical conductivity" in Solid State Sciences 8 (2006) 7-13 published on 21 Oct. 2005, describes $SnO_2$-based ceramics doped with Sb and/or Zn and prepared by solid state reaction at 1300° C. The effect of the dopants on the electronic properties and on the sintering has been studied. While undoped $SnO_2$ ceramics have very low electrical conductivities and lower densities, the Sb-doped ceramics show higher electrical conductivities, with almost no densification and with a significant antimony loss. On the contrary, a high densification and a low conductivity are obtained for Zn-doped ceramics. For this reason, the authors studied $SnO_2$ ceramics co-doped with Sb and Zn ($SnO_2$:Sb:Zn) to combine the advantages of both dopants. X-ray photoelectron spectroscopy analysis confirmed that $Sb^{5+}$ is mainly substituted at the $Sn^{4+}$ sites for the Sb-doped ceramics, in agreement with Hall measurements. In the case of $SnO_2$ samples co-doped with Sb and Zn, high electrical conductivity and density are observed. In addition, the presence of Zn prevents the evaporation of Sb during the sintering.

The process described in this publication inevitably involves a pressing step with pressures of around 185 MPa and the pores of the ceramics described in this publication are of relatively small size. The advantage of this process is limited due to its complexity and the high operating costs that are associated therewith.

The publication entitled "Effect of ZnO addition in $In_2O_3$ ceramics: defect chemistry and sintering behaviour" by Dong-Hyuk Park et al., in Solid State Ionics 172 (2004) 431-434, describes the study of the characteristics of the solution of $Zn^{2+}$ in $In_2O_3$ as a function of the Zn content and of the sintering atmosphere. The solubility limit of Zn in $In_2O_3$ is close to 1 at % when IZO (indium zinc oxide) is sintered in an oxygen atmosphere. Sintering in nitrogen decreases the solubility limit below 1 at %. On the basis of electrical characteristics and microstructural analysis, it has been found that Zn forms a substitutional solid solution with $In_2O_3$ up to 0.5 at % than is converted to an interstitial solid solution below 0.5% when samples are sintered in oxygen. On the contrary, Zn forms an interstitial solid solution when the samples are sintered in nitrogen. In this document defect chemistry based on the unstable $In_2O_3$ structure is discussed.

The process for preparing a ceramic described in this publication implies that the ceramics obtained are done so by pressing at 100 MPa. The ceramics described in this publication have a low electron density per unit volume, which considerably limits the advantage thereof.

The International Application by Societe Nationale Elf Aquitaine published on 24 Jun. 1993 under the number WO 93/12264 describes a process in which, to form a target element, a precursor system is constituted that is capable of giving rise to the inorganic material at a temperature θ between 300° C. and 1600° C. and below the melting point of said material. The precursor system contains an inorganic adjuvant having a melting point less then or equal to θ. The precursor system is applied to a carrier, with the exclusion of a metal felt or foam. The resulting element is brought to the temperature θ and said temperature is maintained for a sufficient time to produce the inorganic material, then the inorganic material/carrier assembly is cooled to ambient temperature while avoiding any quenching phenomenon.

The process described in this publication is characterized by the fact that the adjuvants used are present in an amount of at least 20%, and they are not used to create anion vacancies in the base material by substitution. It is stated in this document that the adjuvant may be a flux such as LiF, LiCl; it should preferably be a lithium, sodium or potassium carbonate. In the case of carbonates, the densification takes place during the release of $CO_2$ during heating. Furthermore, with these adjuvants, the ceramics obtained have low densities, of around 50% of the theoretical density.

The publication by N. Ito et al., entitled "Electrical and optical properties of amorphous indium zinc oxide films", from 28 Sep. 2005, describes an investigation of the valence electron control and electron transport mechanisms of amorphous indium zinc oxide (IZO) films.

$In_2O_3$ doped with tin (Sn) (known as ITO) is a well-known TCO (transparent conductive oxide), attesting to more than 50 years of intensive scientific research and technical applications. In a thin film, ITO shows a remarkable combination of optical and electrical transport properties [1-11]: (i) low electrical resistivity ($\sim 1$-$2\times 10^{-4}$ Ω·cm) and (ii) high optical transparency (>80%) in the visible part of the solar spectrum. However, to attain such properties, the films must be deposited or post-deposition annealed at a temperature equal to or greater than ~200° C. These days, the accent is placed on the preparation of TCO layers having high electronic and optical performances at low deposition temperatures (≤80° C.) in order to be compatible with emerging technologies linked to organic compounds, such as flexible OLEDs (organic light-emitting diodes), polymer-based photovoltaic solar cells, etc., for which low-cost plastic substrates are used. For this reason, the amorphous thin films of indium-zinc oxide (IZO) deposited at low temperature have been increasingly studied [12-22]. In addition to the high optical transparency in the visible range, these X-ray amorphous IZO films have typically low resistivities (3-6×10$^{-4}$ Ω·cm), that is to say that are lower than those measured for the amorphous ITO homologs (7-10×10$^{-4}$ Ω·cm) [10, 18].

The $In_2O_3$—ZnO binary phase diagram includes a series of homologous IZO compounds having the chemical formula $Zn_kIn_2O_{3+k}$ (k=2-9, 11, 13, 15); these oxides display structures that have hexagonal layers and not a bixbyite-type cubic structure because the Zn content exceeds the solubility limit in the $In_2O_3$ bixbyite-type structure [15, 23, 24]. The solubility limit of ZnO in $In_2O_3$ has been found by D. H. Park et al. to be 1-2 mol % [24]. However, it has emerged that the solubility limit of $Zn^{2+}$ in the $In_2O_3$ ceramic increases up to 40 mol % when $In^{3+}$ is co-substituted by $Zn^{2+}$ and $Sn^{4+}$ [25]. Unfortunately, the reported $In_2O_3$ ceramics co-substituted by $Zn^{2+}$—$Sn^{4+}$ have proved to have low apparent densities (≤60% of the theoretical density) and higher resistivities than their ITO homologs [25-27].

Some studies have been reported for TCO films deposited by sputtering using mixtures of $ZnO$—$In_2O_3$—$SnO_2$ powders [28-30] as targets. In order to approach the conductivity of ITO, the films are deposited on glass substrates at temperatures ≥160° C.; consequently, the heat-sensitive (plastic) substrates could not be used. Furthermore, films having multiple compounds $Zn_2In_2O_5$—$ZnSnO_3$ and having a ternary compound $Zn_2In_2O_5$ have been prepared using such targets based on a powder mixture.

There was therefore a need for a process for preparing a target element of ceramic type free of at least one of the drawbacks of the processes of the prior art.

There was also a need for the provision of such a process, capable of being carried out by persons that do not have particular competencies in the ceramic or sintering art, this process advantageously having to result in the obtention of targets or target elements that, in particular, make it possible to easily produce targets of large surface area.

There was also a need for a process that makes it possible to easily obtain dense ceramics, and this advantageously in a single heating step, without having recourse to the costly technique of hot pressing (second process), or to the tricky demolding of a compacted target before it is sintered (first process).

SUMMARY

A first subject of the present invention is constituted by a process for preparing a ceramic from an inorganic base material that is in the form of a powder having a high melting point that is preferably above 300° C.

The process comprises at least:
- a step of mixing the powder of the inorganic base material, preferably in pulverulent form, with a second inorganic component, this also being in powder form, which acts as a dopant for the inorganic base material, said dopant being constituted by a single inorganic material or by a mixture of at least two inorganic materials having a dopant effect on the inorganic base material; and
- a sintering step carried out at a high temperature that is preferably above 800° C., and more preferably still above 1000° C.;

said process being characterized in that the forces exerted on the powders, during the preparation of the mixture of said powders, are less than or equal to 5 kg/cm², preferably less than 1 kg/m².

Preferably, said powder has a particle size characterized by a $d_{50}$ between 10 nanometers and 50 micrometers, more preferably still between 20 nanometers and 30 micrometers.

According to one advantageous embodiment of the process of the invention, the ceramic formed is represented by one of the following formulae (I), (II) or (III) or by a mixture of these formulae that denote the doped material after sintering and in which the anion vacancies are denoted by the symbol □:

(I) $E_{\alpha-x'}{}^k J_{x'}{}^m O_{\beta-x'(K-m)/2}{}^{2-} \square_{x'(k-m)/2}$ with $E_\alpha{}^k O_\beta{}^{2-}$ which denotes the base material and with:

x' which denotes the degree of substitution which is less than α (preferably greater than or equal to 0.1α), β denoting a real number such that 2β=αk, or β=αk/2;

E which is at least one metal from groups I to VIII of the Periodic Table of the Elements, for example Fe, Cu, Ca, W, Mo, Ti, Cr, Sn and In, the symbol k denoting the average degree of oxidation of E calculated according to the formula, the symbol M denoting the average degrees of oxidation of the element J which is partially substituted for E, with m less than k;

α, k and β which are positive numbers, preferably between 1 and 20, such that αk−2β=0, m and x' denoting positive integers such that x'<α and m<k; and (II) $M_{x-x'}{}^q J_{x'}{}^m T_y{}^n O_{z-x'(q-m)/2}{}^{2-} \square_{x'(q-m)/2}$ or (III) $M_x{}^q T_{y-x'}{}^n J_{x'}{}^m O_{z-x'(n-m)/2}{}^{2-} \square_{x'(n-m)/2}$ with $M_x{}^q T_y{}^n O_z{}^{2-}$ which denotes the base material and with:

x' which denotes the degree of substitution and which is less than x in the formula (II) (preferably greater than or equal to 0.1x);

x' which is less than y in the formula (III) as indicated in the present disclosure (preferably greater than or equal to 0.1y), M and T denoting at least two different metals from the Periodic Table of the Elements, for example Li, Na, K, Ag, Cu and Ti for M and Ni, Co, W, Mn, Cr, Fe, V and Ti for T;

the vacancy level is equal to x'(q−m)/2 for $M_{x-x'}{}^q J_{x'}{}^m T_y{}^n O_{z-x'(q-m)/2}{}^{2-} \square_{x'(q-m)/2}$, and to x'(n−m)/2 for $M_x{}^q T_{y-x'}{}^n J_{x'}{}^m O_{z-x'(n-m)/2}{}^{2-} \square_{x'(n-m)/2}$;

x, y, q, n and z are positive integers preferably between 1 and 20, limits included, that satisfy the equation qx+ny=2z;

q which is the degree of oxidation of M;

z which is a real number such that: 2z=qx+ny as indicated;

n which is the average degree of oxidation of T;

m which is the average degree of oxidation of the dopant J, with m which is less than q in the formula (II) and m less than n in the formula (III); and M and T respectively which are at least one metal from the groups I to VIII of the Periodic Table of the Elements, for example Fe, Cu, Co, W, Mo, Ti, Cr, Sn and In.

The inorganic dopant may advantageously contain one or more cations that have a degree of oxidation lower than the cation (or cations) constituting the inorganic base material.

Preferably, the molar ratio of the dopant may, relative to that of the inorganic base component, vary between 0.001 and 0.4, and it is preferably located between 0.01 and 0.1.

According to another preferred variant of the process of the invention:
- in a first step, a mixture of the inorganic base material, doped with at least one dopant, is placed in a container resistant to temperatures above 1100° C., preferably above 1300° C., in the form of a powder that is non-compacted or very slightly compacted, preferably under the action of a pressure below 5 kg/cm², more preferably still under the action of a force of less than 1 kg/m²; and
- in a second sintering and/or annealing step, the container prepared in the previous step is brought to a high temperature which is below the melting point of the constituent material of the target element (this temperature is preferably above 800° C. and below 1700° C.) and for a time which is preferably between 1 and 100 hours, more preferably still of around 12 hours, at ambient atmosphere and more preferably still under an inert atmosphere which is advantageously composed of argon.

The resistant container used may advantageously be constituted by a crucible or mold, resistant to high temperatures, preferably up to 1600° C., and preferably composed of alumina.

The sintering may advantageously lead to a sufficiently dense ceramic in order to be able to be used as a target or target element for sputtering.

The inorganic base material may preferably be chosen from the group composed of oxides, oxyhalides such as an oxychloride and/or oxyfluoride and/or oxysulfide, and mixtures of at least two of the latter.

The oxides may advantageously be chosen from the group composed of $TiO_2$, $SnO_2$, $In_2O_3$, $Li_4Ti_5O_{12}$, $MoO_3$, $WO_3$, $Cr_2O_3$, $Fe_2O_3$, $Li_xNiO_2$ with x between 0.1 and 2 and preferably equal to 1, $Li_xCrO_{2.5}$ with x between 1 and 2, and preferably equal to 1, $LiFeO_2$ and mixtures of at least two of the latter.

Preferably, to carry out the process of the invention, the dopant J is at least one metal from groups I to VIII of the Periodic Table and which has a degree of oxidation m below that of one of the elements/cations of the base material, namely: $m<k$ for $E_\alpha^k O_\beta^{2-}$ and $m<q$ and/or $m<n$ for $M_x^q-T_y^n O_z^{2-}$.

The pairs (inorganic base material, dopant creating the vacancies in the inorganic material) may advantageously be chosen from the group composed of:

$W^{6+}$ as cation of the base material in combination with at least one dopant cation chosen from the group composed of $Nb^{5+}$, $Ta^{5+}$, $V^{5+}$, $Ti^{4+}$, $Sn^{4+}$, $Mn^{4+}$, $Mg^{2+}$, $Zn^{2+}$, $Ni^{3+}$, $Ni^{2+}$, $Cu^{2+}$, $Co^{3+}$, $Co^{2+}$, $Fe^{3+}$, $Cr^{3+}$ and $Mn^{3+}$;

$Mo^{6+}$ as cation of the base material in combination with at least one dopant cation chosen from the group composed of $Nb^{5+}$, $Ta^{5+}$, $V^{5+}$, $Ti^{4+}$, $Sn^{4+}$, $Mn^{4+}$, $Mg^{2+}$, $Zn^{2+}$, $Ni^{3+}$, $Ni^{2+}$, $Cu^{2+}$, $Co^{3+}$, $Co^{2+}$, $Fe^{3+}$, $Cr^{3+}$ and $Mn^{3+}$;

$V^{5+}$ as cation of the base material in combination with at least one dopant cation chosen from the group composed of $Ti^{4+}$, $Sn^{4+}$, $Mn^{4+}$, $Ni^{3+}$, $Co^{3+}$, $Fe^{3+}$, $Cr^{3+}$, $Mn^{3+}$, $Zn^{2+}$, $Mg^{2+}$, $Ni^{2+}$, $Cu^{2+}$ and $Co^{2+}$;

$Nb^{5+}$ as cation of the base material in combination with at least one dopant cation chosen from the group composed of $Ti^{4+}$, $Sn^{4+}$, $Mn^{4+}$, $Ni^{3+}$, $Co^{3+}$, $Fe^{3+}$, $Cr^{3+}$, $Mn^{3+}$, $Zn^{2+}$, $Mg^{2+}$, $Ni^{2+}$, $Cu^{2+}$ and $Co^{2+}$;

$Ta^{5+}$ as cation of the base material in combination with at least one dopant cation chosen from the group composed of $Ti^{4+}$, $Sn^{4+}$, $Mn^{4+}$, $Ni^{3+}$, $Co^{3+}$, $Fe^{3+}$, $Cr^{3+}$, $Mn^{3+}$, $Zn^{2+}$, $Mg^{2+}$, $Ni^{2+}$, $Cu^{2+}$ and $Co^{2+}$;

$Mn^{3+}$ as cation of the base material in combination with at least one dopant cation chosen from the group composed of $Zn^{2+}$, $Mg^{2+}$, $Cu^{2+}$, $Co^{2+}$, $Mn^{2+}$ and $Fe^{2+}$;

$Co^{3+}$ as cation of the base material in combination with at least one dopant cation chosen from the group composed of $Zn^{2+}$, $Mg^{2+}$, $Cu^{2+}$, $Co^{2+}$, $Mn^{2+}$ and $Fe^{2+}$;

$In^{3+}$ as cation of the base material in combination with at least one dopant cation chosen from the group composed of $Zn^{2+}$, $Mg^{2+}$, $Sn^{4+}$, $Cu^{2+}$, $Co^{2+}$, $Mn^{2+}$ and $Fe^{2+}$;

at least one cation of the base material chosen from the group composed of $Co^{2+}$, $Fe^{2+}$, $Zn^{2+}$, $Mg^{2+}$, $Cu^{2+}$, $Ni^{2+}$ and $Mn^{2+}$ in combination with the $Li^+$ cation; and all the mixtures of the inorganic base materials listed previously in combination with the compatible dopants listed previously.

The process of the invention is particularly suitable for preparing ceramics that have a surface area greater than 4 $cm^2$, and preferably between 5 and 1000 $cm^2$.

Advantageously, during the implementation of the process of the invention, the mixing of the powders, preferably the mixing of $In_2O_3$, $SnO_2$ and ZnO, may be carried out in the presence of an organic or aqueous solvent or a mixture of at least one organic solvent and one aqueous solvent.

The organic solvent may preferably be chosen from the group composed of alcohols, ketones, ethers and mixtures of at least two of the latter.

The solvent may preferably be an ether chosen from ether, ethanol, acetone and mixtures of at least two of the latter.

Preferably, the solvent may be of aqueous type based on distilled and/or deionized water.

According to another advantageous embodiment of the process of the invention, the amount of organic solvent used to carry out the mixing of ceramic powders may be between 5 ml and 5 l (liters), preferably between 800 and 1200 ml, per kg of powder mixture.

More advantageously still, 50 ml of ethanol may be mixed with 0.05 kg of a mixture of $In_2O_3$, $SnO_2$ and ZnO.

According to another particularly advantageous embodiment of the process of the invention, the resistivity of the ceramic obtained in said process may be adjusted by controlling the level of at least one of the dopants present in the mixture of powders used as the inorganic base material, said dopants being as defined separately, or in combination, in the widest aspect of the invention. Thus ceramics obtained have low (respectively high) resistivities for high (respectively low) values of at least one of the dopant inorganic base materials preferably chosen from the group composed of $Zn^{2+}$, $Mg^{2+}$, $Cu^{2+}$, $Co^{2+}$, $Mn^{2+}$ and $Fe^{2+}$, more preferably still $Zn^{2+}$. Preferably, the minimum resistivity of the ceramic (which is around $1.7\times10^{-3}$ Ω·cm in the case of ceramics containing $Zn^{2+}$) is obtained for nominal minimal values of 10 mol % of the content of at least one of the dopant inorganic base materials as defined separately or in combination in the widest aspect of the invention (preferably the dopant is chosen from the group composed of $Zn^{2+}$, $Mg^{2+}$, $Cu^{2+}$, $Co^{2+}$, $Mn^{2+}$ and $Fe^{2+}$, more preferably still $Zn^{2+}$).

According to another variant of particular interest of the process of the invention, the charge mobility of the ceramic obtained in said process may be adjusted by controlling the content of dopants present in the mixture of powders used as inorganic base material, said dopants being as defined separately or in combination in the widest aspect of the invention. Preferably, the dopant is chosen from the group composed of $Zn^{2+}$, $Mg^{2+}$, $Cu^{2+}$, $Co^{2+}$, $Mn^{2+}$ and $Fe^{2+}$, more preferably still $Zn^{2+}$, and the charge mobility increases when the content of dopants present in the mixture of powders used as inorganic base material increases (up to 10% in the case of $Zn^{2+}$).

According to another variant of particular interest, the charge mobility obtained in said process may be adjusted by controlling the grain (preferably made of Zn) percolation in the powder mixture used as inorganic base material, high charge mobilities being obtained for high grain percolation values, low charge mobilities being obtained for low grain percolation values.

The process of the invention has, in particular, the advantages of enabling ceramics to be obtained in the form of pellets, preferably of cylindrical shape. The process of the invention also has the advantage of being rapid, simple and inexpensive.

A second subject of the present invention relates to the ceramics obtained by implementing a process as defined in the first subject of the present invention.

These ceramics have at least one, preferably at least two, more preferably at least three, more advantageously still at least four, and most advantageously at least five of the following properties:

1) an improved macroscopic electrical conductivity, measured according to the four-point method (four-probe measurements) with a Keithley device (model 2400 Source Meter), which is greater than 300 siemens per cm, preferably greater then 320 and more advantageously still greater than or equal to 585 siemens per cm;
2) an improved apparent density, measured according to the mercury porosimeter method, using an Autopore IV 9500 Mercury porosimeter, which is preferably greater than 5 g/cm$^3$ (which is the value of the density of a corresponding ceramic prepared without addition of dopant element by the conventional method, pressing the powder at 1 t/cm$^2$ approximately, and then annealing at a temperature of 1300° C.), preferably greater than or equal to 6.57 g/cm$^3$ and more preferably still between 6 and 7.1 g/cm$^3$;
3) a (total) surface area greater than 5 cm$^2$, preferably greater than 50 cm$^2$, more preferably still greater than 100 cm$^2$;
4) an improved percentage of grain boundary irregularities which, measured according to the high-resolution electron microscopy method, is less than 30%, preferably less than 10% of that of a corresponding ceramic prepared without addition of dopant element by the conventional method; and
5) a size of the pores present in the ceramic, measured by the high-resolution SEM method, which is between 0.1 and 0.8 micrometers.

One preferred sub-family of the ceramics of the invention is constituted by ceramics that have a very high crystallinity which, measured according to the X-ray diffraction method (using a Philips PW1820 vertical goniometer in a Bragg-Brentano geometry with a CuK$_{\alpha-\lambda}$ radiation=1.5406 Å; the size of the crystallites was also determined by a JEOL JSM-6700F-type scanning electron microscope), preferably corresponds to a crystallite size between 100 and 200 nm and more preferably to a crystallite size of around 156 nm.

Another preferred sub-family of the ceramics of the invention is constituted by ceramics having a crystalline structure of bixbyite type, also known as a c-type rare-earth oxide structure.

Another preferred sub-family of the invention is constituted by ceramics having at least one improved electrical property relative to ITO-type ceramics.

The ceramics of the invention may advantageously have a conductivity which, measured according to the four-point method and as a function of the temperature varying from 4.2 K to ambient temperature, is between 200 and 10000, preferably between 300 and 5000 siemens per cm, and more preferably still around 580 siemens per cm.

Preferably, the ceramics of the invention have improved electrical properties relative to the ITO-type ceramic.

The ceramics of the invention may advantageously have an improved charge mobility which, measured according to the Seebeck effect method, is between 0.01 and 300, and preferably between 0.1 and 50 cm$^2$/vol·s$^{-1}$.

The ceramics of the invention characterized by a charge mobility greater than 10.1 cm$^2$/vol·s$^{-1}$ have a particular advantage.

The ceramics of the invention obtained from a mixture containing 82.23 mol % of inorganic base material of formula In$_2$O$_3$ and 8.66 mol % of dopant SnO$_2$ and 9.11 mol % of dopant ZnO, the latter dopant (ZnO) providing the densification, are particularly advantageous and are characterized by:
  an electrical conductivity between 300 and 500 siemens per cm and preferably around 330 siemens per cm;
  a density between 6 and 7.1 g/cm$^3$, and preferably around 6.57 g/cm$^3$;
  a (total) surface area between 1 and 1000 cm$^2$; and
  a percentage of irregularities between 5 and 20%, and preferably less than 10%.

The conductivity of these ceramics may advantageously be greater than 70%, preferably between 80% and 100%, and more advantageously greater than 90% of the theoretical conductivity. These ceramics preferably comprise molar percentages of SnO$_2$ and ZnO between 3% and 15% with a percentage of ZnO greater than or equal to that of SnO$_2$. Preferably, the percentage of ZnO is greater than that of SnO$_2$.

A third subject of the present invention is constituted by the use of a ceramic obtained by a process as defined in the first subject of the present invention, or as defined in the second subject of the present invention, as a target for RF or DC sputtering and PLD (pulse laser deposition) techniques and PVD (physical vapor deposition) techniques.

The present invention covers uses in the laboratory and in industrial production equally well.

A fourth subject of the present invention is constituted by a process for preparing a transparent and conductive metal film by sputtering at least one ceramic as obtained by implementing a process as defined in the first subject of the invention, or as defined in the second subject of the invention.

The sputtering may advantageously be carried out under temperature conditions between 25 and 500° C., and preferably at ambient temperature.

The duration of the sputtering may advantageously be between 1 minute and 10 hours. Preferably, it is around 1 hour.

The sputtering may advantageously be carried out in an atmosphere predominantly composed of rare gases, preferably in an atmosphere composed of 99.8% argon and 0.2% oxygen.

The sputtering power density may preferably be between 0.1 and 15 watts/cm$^2$, preferably around 0.5 watt/cm$^2$.

The distance between the ceramic target and the substrate on which the thin film is deposited may, preferably, be between 3 and 15 cm, and it is more advantageously around 7 cm.

A fifth subject of the present invention is constituted by a transparent film and/or electrode obtained by implementing a process as defined in the fourth subject of the present invention. The film may constitute a transparent electrode film or a transparent film.

In the context of the present invention, a transparent electrode film may be obtained by sputtering onto optoelectronic devices such as solar cells, organic light-emitting diodes, flexible OLEDs, polymer-based photovoltaic solar cells, etc.

One advantageous sub-family of films and/or electrodes according to the present invention may be constituted by films or electrodes having a transmission coefficient which, measured according to the method of the transmission spectrum of films in the UV/visible/NIR region (recorded using a Carry 5000 type spectrometer in the range 200-2500 nm), is in the visible range and is between 90 and 100%. Preferably, the transmission coefficient is greater than 95%.

Preferably, the films or electrodes according to the invention have a conductivity which, measured according to the four-point method, is greater than or equal to 1000 siemens/cm, more advantageously still greater than 2250 siemens/cm.

Another particularly advantageous sub-family of films or electrodes according to the invention may be constituted by the films or electrodes obtained from a target ceramic chosen from the ceramics of formula:
  In$_{1.805}$Sn$_{0.095}$Zn$_{0.10}$O$_{3-\delta}$ (conductive) with $\delta$ preferably between 0.001 and 0.03, more preferably still equal to around 0.005;
  In$_{1.94}$Zn$_{0.06}$O$_{2.97}$ (conductive), Li$_4$Ti$_{4.5}$Mg$_{0.5}$O$_{11.5}$ (insulating, i.e. with a conductivity below 10$^{-4}$ S/cm); Li$_4$Ti$_{4.5}$Zn$_{0.5}$O$_{11.5}$ (insulating, i.e. with a conductivity below 10$^{-4}$ S/cm);

$Li_4Ti_{4.5}Ni_{0.5}O_{11.75}$ (insulating, i.e. with a conductivity below $10^{-4}$ S/cm); and mixtures of at least two of the latter ceramics.

BRIEF DESCRIPTION OF THE DRAWINGS

FIGS. 1A, 1B, 1C, 1D and 1E represent different steps carried out to produce a high-density ceramic according to the invention and also photos of a crucible filled with the compacted powder mixture defined in example 1' and the corresponding ceramic obtained after heat treatment of the compacted powder according to the method of the invention.

FIGS. 2A and 2B represent a SEM photo of an ITO ceramic (FIG. 2A) obtained in example 0 according to the prior art technique and a photo of the ITZO ceramic (FIG. 2B) obtained in example 1', by treatment of the same powder to which a dopant element has been added.

FIG. 3 is a diagram representing the conventional (RF) sputtering process and the various elements involved.

FIGS. 26A, 26B and 26C represent the SEM micrographs for the ITZO thin film deposited with an RF sputtering power of 0.5 W/cm$^2$ (FIG. 26A), 1.5 W/cm$^2$ (FIG. 26B) and 2.5 W/cm$^2$ (FIG. 26C).

FIGS. 27A, 27B and 27C represent the AFM images for the ITZO thin film deposited at various sputtering powers: 0.5 W/cm$^2$ (FIG. 27A), 1.5 W/cm$^2$ (FIG. 27B) and 2.5 W/cm$^2$ (FIG. 27C), at various scales of the z axis.

DETAILED DESCRIPTION OF PREFERRED EMBODIMENTS

Figure 4:
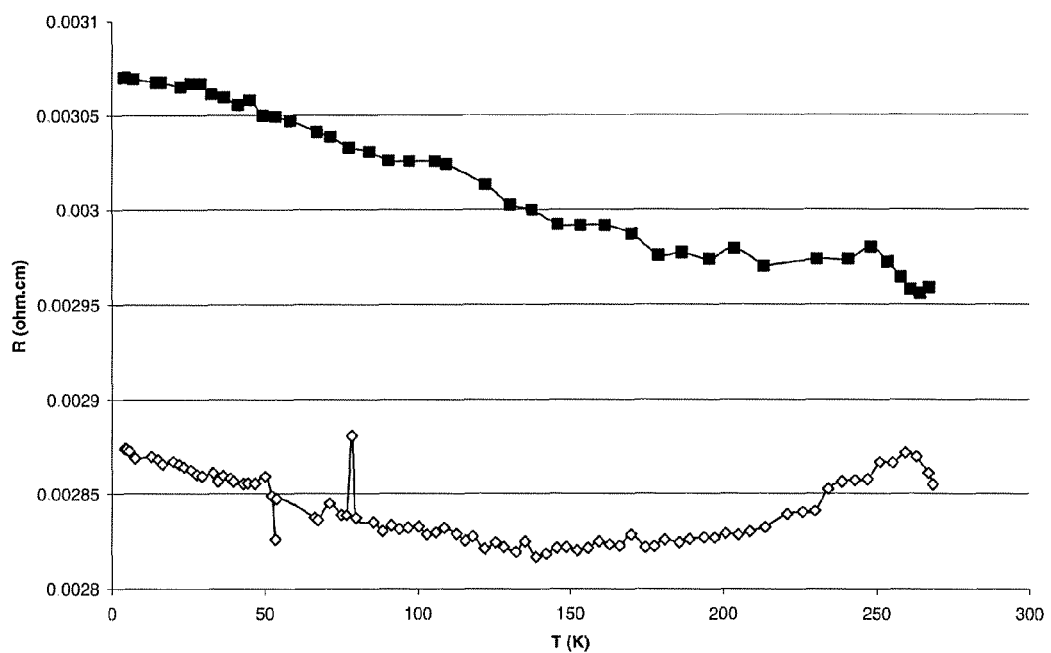
FIG. 4 represents the electrical resistivities obtained for the ITO ceramic prepared in example 0 (top curve) and for the ITZO ceramic prepared in example 1' (bottom curve).

Within the context of the present disclosure, the following aspects are considered.

The inorganic material forming the target base element may be most particularly an oxide, but it may also be an oxyhalide such as an oxychloride and/or oxyfluoride and/or oxysulfide and, in particular, an oxide having one or other of the formulae $E_\alpha{}^k O_\beta{}^{2-}$ and $M_x{}^q T_y{}^n O_z{}^{2-}$.

The purpose of the doping created in the base material is to generate anion vacancies in the base material, thus promoting the production of dense ceramics (having a density between 70 and 100% and preferably greater than or equal to 90%). It is therefore necessary, in accordance with the invention, that the cation of the dopant has a degree of oxidation m (real number) that imperatively is below that of the cation in the base material, that is to say m<k in $E_\alpha{}^k O_\beta{}^{2-}$ and m<q and/or m<n in $M_x{}^q T_y{}^n O_z{}^{2-}$. The formulae of the materials that are doped and that therefore have anion vacancies favorable to sintering without (or with low) prior compacting, may thus be written, with J denoting the dopant and m its degree of oxidation:

1) for $E_\alpha{}^k O_\beta{}^{2-}$ which denotes the base material: $E_{\alpha-x'}{}^k J_{x'}{}^m O_{\beta-x'(k-m)/2}{}^{2-} \square_{x'(k-m)/2}$ which denotes the doped material, with:
   the anion vacancies denoted by $\square$;
   x' which denotes the degree of substitution is less than α (preferably greater than or equal to 0.005α); and 2) for $M_x{}^q T_y{}^n O_z{}^{2-}$ which denotes the base material: the formula $M_{x-x'}{}^q J_{x'}{}^m T_y{}^n O_{z-x'(q-m)/2}{}^{2-}\square_{x'(q-m)/2}$ or $M_x{}^q T_{y-x'}{}^n J_{x'}{}^m O_{z-x'(n-m)/2}{}^{2-}\square_{x'(n-m)/2}$ and/or a combination of the two formulae which denote the doped material, with:
   x' which denotes the degree of substitution which is less than x in the formula $M_{x-x'}{}^q J_{x'}{}^m T_y{}^n O_{z-x'(q-m)/2}{}^{2-}\square_{x'(q-m)/2}$ as indicated in the disclosure (preferably greater than or equal to 0.005x);
   x' is less than y in the formula $M_x{}^q T_{y-x'}{}^n J_{x'}{}^m O_{z-x'(n-m)/2}{}^{2-}\square_{x'(n-m)/2}$, preferably x' being greater than or equal to 0.005y.

It will be observed that the anion vacancies that are created do not bear a charge, whereas the other elements bear a charge, for example oxygen bears the negative charge 2−; the cation M bears the positive charge q; the cation T bears the positive charge n; etc.

The process according to the present invention makes it possible to prepare, from an inorganic base material, a target element for sputtering. It consists in adding, to the inorganic base material, another inorganic material of dopant type. This inorganic material advantageously contains one or more cations preferably having a degree of oxidation below the cation (or cations) constituting the inorganic base material.

The powder mixture thus obtained is not subjected to any particular force or only to those necessary for carrying out a light compacting thereof.

The atomic ratio of the dopant relative to that of the inorganic base material preferably varies between 0.005 and 0.2, and it is advantageously located between 0.05 and 0.06.

The inorganic base material thus doped is simply placed in the form of a compacted or non-compacted powder in a suitable crucible or mold, that withstands high temperatures, preferably up to 1600° C. Such a crucible or mold may be, for example, based on alumina. The sintering of the doped inorganic material, thus positioned, takes place when the crucible or mold is brought to a high temperature (above 800° C. and below the melting point of the base material).

It has been found that, unexpectedly, the sintering leads to a ceramic that is sufficiently dense to be able to be used as a target or target element for sputtering.

Without being bound by theory, the formulae are presented in this disclosure as being a representation of the preferred ceramics obtained by the implementation of the processes of the invention.

In the formulae, E is at least one metal from groups I to VIII of the Periodic Table of the Elements, for example Fe, Cu, Co, Ni, W, Mo, Ti, Cr, Sn and In. M and T denote at least two different metals from the Periodic Table, for example Li, Na, K, Ag, Cu and Tl for M and Ni, Co, W, Mn, Cr, Fe, V and Ti for T. The symbols k, q and n denote the average degrees of oxidation of E, M and T respectively. The parameters α and β are positive integers that satisfy the formula αk−2β=0 and x, y and z denote positive integers such that qx+ny−2z=0.

As examples of such oxides mention may be made, non-limitingly, of $TiO_2$, $In_2O_3$, $Li_4Ti_5O_{12}$, $MoO_3$, $Cr_2O_3$, $Fe_2O_3$, $Li_xNiO_2$, $Li_xCrO_2$, $Li_xCoO_2$ and $LiFeO_2$.

The dopant J, responsible for the densification, is preferably at least one metal from groups I to VIII of the Periodic Table but which imperatively has, in the cation state, a degree of oxidation m below that of one of the elements-cations of the base material, namely: 0<m<k for $E_\alpha{}^k O_\beta{}^{2-}$ and 0<m<q and/or 0<m<n for $M_x{}^q T_y{}^n O_z{}^{2-}$.

It has surprisingly been discovered that doping of the $E_\alpha{}^k O_\beta{}^{2-}$ compound with an oxide (or halide or oxyhalide) having the dopant element $J^m$ partially substituted for E, in the aforementioned proportions referred to here as x' (with x' strictly less than α, i.e. 0<x'<α), generates the formation of anion vacancies y$\square$, according to $E_{(\alpha-x')}{}^k J_{x'}{}^m O_{\beta-y}{}^{2-}\square_y$; y is then strictly a positive number less than β such that 2y≅x'(k−m), i.e. y≅x'(k−m)/2. For example, for $TiO_2$, the dopant may be ZnO or MgO. Specifically, the zinc and magnesium have a degree of oxidation equal to +2, that is to say less than the degree of oxidation of +4 of titanium. In the case of MgO used as a dopant for example, it will be written: $Ti_{1-x'}Mg_{x'}O_{2-x'}\square_{x'}$, for $TiO_2$ thus doped. The index x' may vary between 0.0053 and 0.2 and preferably varies from 0.05 to 0.06, which corresponds substantially to a dopant level, measured per mole (or atom) of Ti, or per mole of $TiO_2$, between 0.5 and 20%, and preferably from 5 to 6%.

These anion vacancies which are neutral, that is to say uncharged, favor the densification of the final material obtained during its heating or annealing under the aforementioned conditions. Similarly, the doping of the $M_x{}^q T_y{}^n O_z{}^{2-}$ compound with an oxide (or halide or oxyhalide) having the dopant element $J^m$ partially substituted for T, in the aforementioned proportions referred to here as x' (with x' strictly less than y), seems to generate the formation of anion vacancies y$\square$, according to $M_x{}^q T_{(y-x')}{}^n J_{x'}{}^m O_{(x-y)}{}^{2-}\square_y$; y is then strictly a positive number less than z such that 2y≅2x'(n−m), i.e. y≅x'(n−m)/2. Furthermore, and in a similar manner, the doping of the $M_x{}^q T_y{}^n O_z{}^{2-}$ compound with an oxide (or halide or oxyhalide) having the dopant element $J^m$ partially substituted for M, in the aforementioned proportions referred to here as x' (with x' strictly less than x), seems to generate the formation of anion vacancies y$\square$, according to $M_{(x-x')}{}^q J_{x'}{}^m T_y{}^n O_{(z-x')}{}^{2-}\square_y$; y is then strictly a positive number less than x' which satisfies the equation 2y=x'(q−m), i.e. y≅x'(q−m)/2. The J dopant (or dopants) may be partially substituted both for M and T. The corresponding formulae then result from the combination of the two aforementioned formulae. These anion vacancies favor the densification of the final material obtained during its heating or annealing under the aforementioned conditions.

For example, for $Li_4Ti_5O_{12}$, the dopant may be ZnO or MgO since zinc and magnesium have a degree of oxidation equal to +2, that is to say less than the degree of oxidation of +4 of the titanium.

In the case of MgO used as a dopant for example, it will be written: $Li_4Ti_{5-x'}Mg_xO_{12-x'}\square_{x'}$; for $Li_4Ti_5O$ thus doped, x' may vary between 0.025 and 1 and preferably is equal to 0.25-0.3, which corresponds substantially to a dopant level, measured per mole (or atom) of Ti between 0.5 and 20%, and preferably from 5 to 6%.

When the process of doping with zinc $Zn^{2+}$ or other cations ($Mg^{2+}$, $Cu^{2+}$ etc.) having a degree of oxidation lower than that of the base oxide is applied to the following oxides, they result in novel oxides, especially those which have doping levels between 0.5 and 20% and preferably between 5 and 6%:

$TiO_2$, $MoO_3$, $WO_3$, $Cr_2O_3$, $Fe_2O_3$, $Li_xNiO_2$ with x between 0.1 and 2 and preferably equal to 1, $Li_xCrO_{2.5}$ with x between 1 and 2, and preferably equal to 1, $LiFeO_2$; and $Li_4Ti_5O_{12}$, for which the titanium is in the average degree of oxidation of +4, doped with $Ni^{2+}$ and/or $Ni^{3+}$; a co-doping with Zn/Ni is also novel. The dopant level is the aforementioned (between 0.5 and 20% and preferably from 5 to 6%).

According to one preferred embodiment of the invention, the films (or electrodes) are prepared by sputtering from ceramics (or targets) of novel composition $In_{1.805}Sn_{0.095}Zn_{0.10}O_3$. They give rise, including on a plastic carrier such as PET, to transparent (90% transmission in the visible range) and conductive (>1000 siemens/cm) electrodes that have remarkable performances.

This material has a density of 6.57 g/cm³, which corresponds to 92% of the theoretical density, measured according to the mercury porosimeter method (Autopore IV 9500 Mercury Porosimeter). This density is amply sufficient so that the ceramics can be used as a target for sputtering. Below 70% of the theoretical density, the targets tend to crack during the sputtering and, furthermore, the plasma does not always remain homogeneous during the sputtering process leading to films that are inhomogeneous in composition, and therefore unreproducible. This is not the case for densities greater than 70%, and preferably greater than 80% as is the case here, since the density is greater than 90%.

The density of a corresponding ceramic prepared without addition of dopant element via the conventional method (pressing of the powder at 1 t/cm² approximately, and then annealing at a temperature of 1300° C.) is 5 g/cm³, i.e. 70% of the theoretical density. Under these conditions, it has been observed that it is impossible to prepare a ceramic without the aforementioned dopants by the method according to the invention.

It is furthermore stated that the commercial ITO ceramics, which have a density of around 90%, are prepared by the heavy-duty and expensive "hot-pressing" technique of the prior art.

The process of the present invention therefore makes it possible to prepare ceramics that have densities at least as high, in a manner that is much more flexible, simple and less expensive than the techniques known from the prior art.

Another advantage is that it is thus possible to prepare, by the method of the invention, ceramics having a large surface area which may be greater than 100 cm², on condition of using the aforementioned dopants.

Finally the ceramics thus obtained have original intrinsic features especially including a pore size which is substantially greater (generally by 3 to 10%, preferably by 4 to 5%) than that of similar ceramics from the prior art, although having comparable electrochemical conductivities.

It is possible that there are other explanations for explaining the high density of the ceramic materials obtained.

EXAMPLES

The examples explained below are given by way of illustration only and should not be interpreted as constituting any limitation of the subject of the present invention.

Example 0

Preparation of a Commercial-Type ITO Ceramic

In order to prepare the circular ITO target (ceramic) (FIG. 2A) having a diameter of 5 cm and of $In_{1.9}Sn_{0.1}O_3$ composition and having a weight equal to 50 g, the experimental protocol detailed below was followed.

Figure 34:
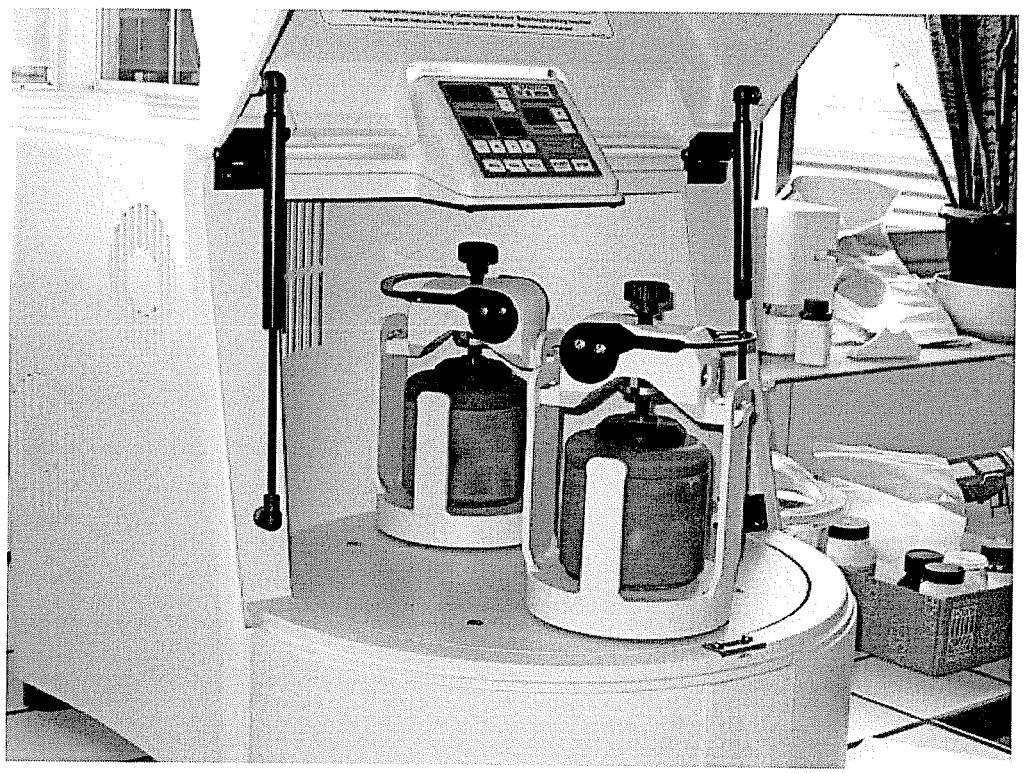
FIG. 34 shows the material used for implementing the "ball-milling" method used in the examples.

Step 1) 47.3173 g of $In_2O_3$ and 2.6827 g of $SnO_2$ were mixed using the well-known technique of "ball-milling" with the 05.600 FRITSCH apparatus; for this purpose, the aforementioned mixture of powder was put into one of the two agate grinding bowls from FIG. 34 each containing 50 agate balls having a diameter of 8 mm; 30 ml of ethanol was added; it was covered with an agate lid as indicated in the figure; the "ball-milling" was then carried out for 3 hours at 250 rpm as indicated in the figure. The powder thus mixed in ethanol was then put into a beaker and the powder was dried by heating it at 110° C. for 8 hours in air.

Step 2) The powder was placed in a cylindrical stainless steel mold having an internal diameter of 60 mm and the powder was pressed at 25 tonnes/cm² for 10 minutes. A compacted target was thus obtained.

Step 3) The compacted target was gently (since it is very fragile) conveyed to an alumina carrier and the carrier with the target was heated at a rate of 300° C. per hour in a muffle furnace, shown on the left-hand side of the image, until the temperature of 1300° C. was reached, which was held for 12 hours; next it was cooled at a rate of 300° C. per hour. Then the desired ITO ceramic (FIG. 2A) was obtained that can be used for sputtering.

Example 1

ITZO Targets for the Preparation of Transparent and Metallic Electrodes for Optoelectronic Devices According to a first preferred embodiment of the invention, when the inorganic base material is the oxide $In_2O_3$ or tin-doped $In_2O_3$ (commonly known as ITO), for which indium is in the average degree of oxidation of +3, the dopant may advantageously be zinc oxide or magnesium oxide (preferable to a zinc or magnesium halide or oxyhalide, even if the latter have a certain advantage) for which the degree of oxidation of the zinc or of the magnesium is +2, that is to say lower than that of +3 of the indium.

Even when the molar ratio of the dopant relative to that of the indium oxide is as low as 0.06, sufficiently dense ceramics for being able to be used as a target or target element for sputtering are obtained by simple heating (which may be in air) at temperatures above 1100° C. (ideally 1300° C.) following the aforementioned method and when said assembly is held at this temperature for a sufficient duration to convert the precursor system to said inorganic ceramic material.

Furthermore, these ceramics have a sufficiently high electrical conductivity so that DC-mode sputtering (adapted to the industrial scale) can advantageously be used. Thus obtained by DC (or RF) sputtering from these targets are films having optoelectronic properties at least equal to those of commercial ITO ceramics.

Example 1'

ITZO Degenerate Semiconductor for Preparing Transparent and Metallic Electrodes for Optoelectronic Devices In order to prepare the ITZO targets, in the example circular targets having a diameter of 5 cm and an $In_{1.805}Sn_{0.095}Zn_{0.10}O_3$ composition and having a weight equal to 50 g, three successive steps were followed according to the experimental protocol detailed below.

In step 1) 45.8881 g of $In_2O_3$, 2.6217 g of $SnO_2$ and 1.4902 g of ZnO were mixed using the well-known technique of "ball-milling"; for this purpose, the aforementioned mixture of powder was put into one of the two agate grinding bowls from FIG. 34 each containing 50 agate balls having a diameter of 8 mm; 30 ml of ethanol was added; it was covered with an agate lid as indicated in FIG. 34; the "ball-milling" was then carried out for 3 hours at 250 rpm as indicated in the figure. The powder thus mixed in ethanol was then put into a beaker and the powder was dried by heating it at 110° C. for 8 hours in air.

In step 2), the powder was then placed, by pressing by hand with a 3 cm diameter stainless steel cylinder, in a flat-bottomed alumina container having a diameter of 75 mm (FIG. 1D).

In step 3) the container was heated at a rate of 300° C. per hour in a muffle furnace, presented on the left-hand side of the image, until the temperature of 1300° C. was reached which was held for 12 hours; next it was cooled at a rate of 300° C. per hour. Then the desired ceramic (FIG. 1E) was obtained that can be used for sputtering.

The density of the ceramics obtained in step 3, measured with a mercury porosimeter (AutoPore IV 9500), was 91% of the theoretical density. Their electrical resistivity that is advantageously very low, lower than that of the ITO ceramics, is illustrated in FIG. 4.

These particularly advantageous features confirm that the ITZO ceramics of the present invention may advantageously be used industrially in DC sputtering.

Example 2

Targets for the Preparation of Electrodes for Electrochemical Devices (Microgenerators, Electrochromic Devices)

According to a second preferred embodiment of the invention, when the inorganic base material is the oxide $Li_4Ti_5O_{12}$, for which the titanium is in the average degree of oxidation of +4, the dopant may advantageously be the zinc oxide ZnO or the magnesium oxide MgO or a transition metal oxide such as NiO or $Ni_2O_3$, for which the degree of oxidation of the zinc or of the magnesium is +2, that of the nickel +2 or +3, that is to say below that of +4 of the titanium. Even when the molar ratio of the dopant relative to that of the indium oxide is as low as 0.06, sufficiently dense ceramics for being able to be used as a target or target element for sputtering are obtained by simple heating (which may be in air) at temperatures above 1100° C. (ideally 1300° C.), following the aforementioned method. It is thus possible to obtain by RF sputtering of these targets films that can advantageously be used as electrodes for microgenerators (lithium batteries) or for electrochromic devices.

Example 2'

Target Based on $Li_4Ti_5O_{12}$ Doped with Zn for Preparing Electrodes for Microgenerators and for Electrochromic Devices The experimental protocol used for ITZO was used with the difference that the starting products were lithium carbonate, titanium dioxide and zinc or magnesium monoxide.

Thus, in order to prepare the targets based on Zn-doped $Li_4Ti_5O_{12}$, in the example circular targets having a diameter of 5 cm and an $Li_4Ti_{4.70}Zn_{0.30}O_{11.7}$ composition and having a weight equal to 50 g, three successive steps were followed according to the experimental protocol detailed below.

In step 1) 16.07 g $Li_2CO_3$ (corresponding to 6.50 g of $Li_2O$), 40.85 g of $TiO_2$ and 2.65 g of ZnO were mixed using the well-known technique of "ball-milling"; for this purpose, the aforementioned mixture of powder was put into one of the two agate grinding bowls from FIG. 34 each containing 50 agate balls having a diameter of 8 mm; 30 ml of ethanol was added; it was covered with an agate lid as indicated in FIG. 34; the "ball-milling" was then carried out for 3 hours at 250 rpm. The powder thus mixed in ethanol was then put into a beaker and the powder was dried by heating it at 110° C. for 8 hours in air.

In step 2), the powder was then placed, by pressing by hand with a 3 cm diameter stainless steel cylinder, in a flat-bottomed alumina container having a diameter of 75 mm.

In step 3) the container was heated at a rate of 300° C. per hour in a muffle furnace, presented on the left-hand side of the image, until the temperature of 1300° C. was reached which was held for 12 hours; next it was cooled at a rate of 300° C. per hour. Then the desired ceramic (FIG. 1E) was obtained that can be used for sputtering.

The density of the ceramics obtained in step 3, measured with a mercury porosimeter (AutoPore IV 9500), was 93% of the theoretical density. Their electrical resistivity was high, of the order of $10^7$ $\Omega \cdot cm$, confirming the insulating nature of the ceramics. Therefore, the ceramics will have to be used industrially in RF sputtering.

The tests carried out demonstrate that the invention provides a simple, rapid and inexpensive process for preparing a target element of the ceramic type for sputtering constituted of an inorganic material having a melting point above 300° C. Such a process may be carried out by persons who do not have particular competencies in the ceramic or sintering art and it easily leads to the production of targets or target elements that especially make it possible to easily produce targets of large surface area.

Industrialists prepare targets such as ITO by hot-pressing; this is one of the reasons why the targets are expensive. The products (ceramics) prepared according to the invention are therefore less expensive and also appear novel due to the fact that the "accelerated sintering" by the addition of elements such as, for example, ZnO in ITO or in indium oxide (described in the disclosure) substantially increases the electrical conductivity of the ceramics (when doped with 2 mol % of ZnO, the conductivity of ceramic ITO is approximately doubled); this is because, surprisingly, it appears that the percolation between the grains is improved and that grain boundary problems that impair the macroscopic conductivity are further avoided. The SEM photos from FIGS. 2A and 2B show an industrial ITO ceramic with grain boundaries, and the ITO ceramic of the invention, doped with zinc.

Example 3

Ceramic of $In_{1.862}Sn_{0.098}Zn_{0.04}O_3$ Composition, Prepared Under Similar Experimental Conditions Used in Example 1'

The ceramic of $In_{1.862}Sn_{0.098}Zn_{0.04}O_3$ composition is prepared as follows:

Step 1) 46.7410 g of $In_2O_3$, 2.6704 g of $SnO_2$ and 0.5886 g of ZnO were mixed using the well-known technique of "ball-milling" (see FIG. 34); for this purpose, the aforementioned mixture of powder was put into one of the two agate grinding bowls from FIG. 34 each containing 50 agate balls having a diameter of 8 mm; 30 ml of ethanol was added; it was covered with an agate lid as indicated in the figure; the "ball-milling" was then carried out for 3 hours at 250 rpm as indicated in the figure. The powder thus mixed in ethanol was then put into a beaker and the powder was dried by heating it at 110° C. for 8 hours in air.

Step 2) The powder was then placed, by pressing by hand with a 3 cm diameter stainless steel cylinder, in a flat-bottomed alumina container having a diameter of 75 mm (FIG. 1D).

Step 3) The container was heated at a rate of 300° C. per hour in a muffle furnace, presented on the left-hand side of the image, until the temperature of 1300° C. was reached which was held for 12 hours; it was then cooled at a rate of 300° C. per hour. The aforementioned low-density ceramic was thus obtained that cannot be used as a target for sputtering.

The ceramic of $In_{1.862}Sn_{0.098}Zn_{0.04}O_3$ composition thus obtained has a density, measured by the aforementioned technique, of 2.76 g/cm$^3$, which only represents 40% of the theoretical density which is considerably below the limit of 70% that corresponds to the possibility of using as a target for sputtering.

The conductivity of this ceramic is equal to 50 siemens per cm only, measured by the aforementioned technique; it is thus 6 times lower than that of $In_{1.805}Sn_{0.095}Zn_{0.10}O_3$.

Example 4

Ceramic of $In_{1.812}Sn_{0.080}Zn_{0.098}O_{3-\delta}$ Composition, Prepared for the Application of Films Deposited by Sputtering onto Glass and PET Substrates

The ceramic of $In_{1.812}Sn_{0.080}Zn_{0.098}O_{3-\delta}$ composition is prepared as follows:

Step 1) 50 g of $In_2O_3$, $SnO_2$ and ZnO powders, in suitable amounts, according to the optimized composition of the $[In_2O_3:Sn_{0.10}]:Zn_{0.10}$ ceramic, were mixed using the well-known technique of "ball-milling"; for this purpose, the aforementioned mixture of powder was put into one of the two agate grinding bowls each containing 50 agate balls having a diameter of 8 mm; 30 ml of ethanol was added; it was covered with an agate lid as indicated in the figure; the "ball-milling" was then carried out for 3 hours at 250 rpm as indicated in FIG. 34. The powder thus mixed in ethanol was then put into a beaker and the powder was dried by heating it at 110° C. for 6 hours in air.

Figure 15A:
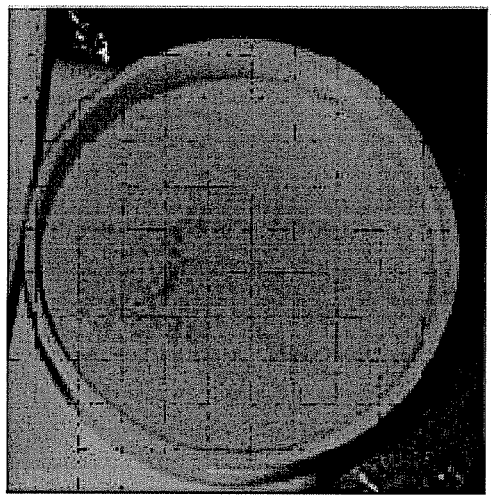
FIGS. 15A, 15B, 15C and 15D are a schematic representation of the preparation of the dense ITZO ceramic, FIG. 15A being a photograph of the mixture of lightly pressed powders in an alumina crucible, FIG. 15B being a photograph of the dense ITZO ceramic obtained after sintering, showing the shrinkage, the sintering temperature being 1300° C. for 12 hours, FIGS. 15C and 15D being diagrams corresponding to the photographs.
Figure 15B:
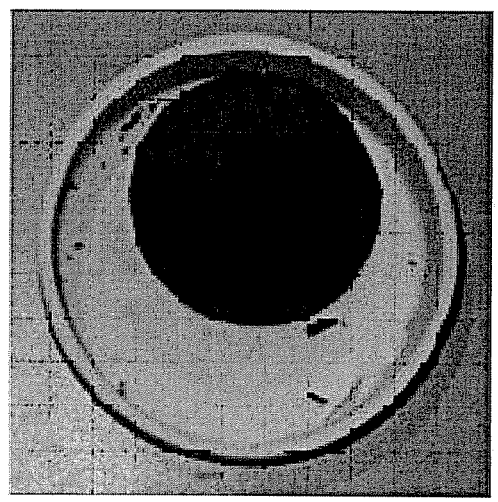
Figure 15C:
Figure 15D:
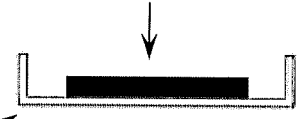
Figure 16:
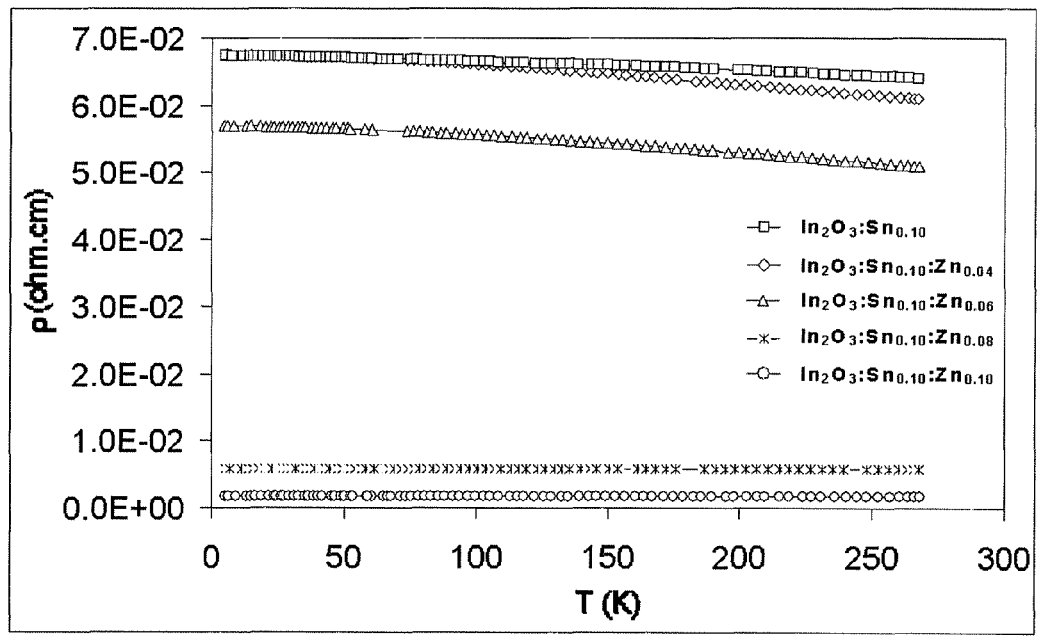
FIG. 16 represents the change in the resistivity with temperature for various nominal Zn contents ($Zn_y$) in the ITZO ceramic ($[In_2O_3:Sn_{0.10}]:Zn_y$) with $0 \le y \le 0.10$, y=0 ($In_2O_3:Sn_{0.10}$) representing the ITO ceramic.

Step 2) The powder was lightly pressed by hand in a flat-bottomed alumina container having a diameter of 82.56 mm (FIG. 15A).

Step 3) The container was heated at a rate of 300° C. per hour in a muffle furnace, until the temperature of 1300° C. was reached which was held for 12 hours; next it was cooled at a rate of 300° C. per hour. Thus the ceramic having a relative density of around 92% was obtained. A ceramic having a final diameter of 50 mm was obtained after the sintering and polishing steps.

The ITZO films deposited by sputtering on the PET substrates had higher optoelectronic performances than the commercial-type ITO films. In terms of optical properties, the ITZO films had a high visible transparency (greater than 86% for the films deposited on a glass substrate and greater than 80% for those deposited on a PET substrate). The resistivity of these films was low (around $4.4 \times 10^{-4}$ Ω·m for the films deposited on glass and of the order of $4.7 \times 10^{-4}$ Ω·m for the films deposited on PET) compared to those of the commercial-type ITO films deposited on the same substrates.

Characterization of the Structures

The characterizations carried out show, in particular, that the co-doping of $In_2O_3$ with $Sn^{4+}$ and $Zn^{2+}$ (ITZO) forms a solid solution, that makes it possible to prepare novel highly dense and conductive ITZO ceramics. It is thus established that the co-doping, in particular with the zinc, makes it possible to prepare a highly dense ceramic target and a large conductive surface area suitable for both types of DC and RF sputtering. The synthesis of such a target has thus been able to be carried out successfully by direct sintering of the powder mixture placed in a suitable container without using a cold or hot (expensive) pressing procedure. The ITZO thin films deposited on glass and plastic substrates were then deposited at ambient temperature using the ceramic target with the optimized composition. The influence of the sputtering conditions on the optoelectronic properties of the films was also established.

Preparation of the ceramics—$In_2O_3$ (99.99%, Aldrich), $SnO_2$ (99.9%, Aldrich) and ZnO (99.9%, Aldrich) powders were used to prepare ITZO ceramics. Suitable amounts of selected oxides were milled by ball-milling for 30 min in an agate bowl containing agate balls and ethanol. The alcohol was then evaporated at 110° C. for 6 hours. After drying, the powder was ground in an agate mortar and a cylindrical crucible made of alumina having a diameter of 16 mm was filled with it, and it was then pressed by hand. The mixed powder, with which the crucible was filled, was finally sintered at 1300° C. in air for 12 hours. The dimensions of the granules obtained were measured with digital vernier calipers, and the granules were weighed using an analytical balance, these measurements allowing the apparent densities of the granules to be estimated.

Chemical composition and apparent density—According to the literature [11, 28, 31-35], the best conductivity results were obtained for an amount of $Sn^{4+}$ which varied from ~6-10 mol % in $In_2O_3$, depending on the synthesis conditions. The $Sn^{4+}$ content in the present ceramics was set at 10 mol % and the initial $Zn^{2+}$ content varied in the co-doped ceramic from 0-10 mol %. For reasons of clarity, a simplified sample identification underlining the influence of the doping of Zn in ITO has been adopted (Table I).

The EPMA results, reported in Table I, show that there is good agreement between the final compositions of the ceramic after sintering and the nominal starting compositions. The Zn content in the final composition of the ceramic having the nominal composition $In_2O_3:Zn_{0.02}$ (IZO) reaches ~1.4 mol %. It should be noted that this value is consistent with the reported solubility limit of ZnO in $In_2O_3$ (~1-2 mol %) [24, 36]. A slight loss of $SnO_2$ that varies from ~0.5-1 mol % (which corresponds to ~0.27 to 0.54 wt %) is also observed for the two ITZO and ITO ceramics (Table I).

Table I presents: chemical composition of the ceramic and apparent density for the (ITZO) ceramics [In$_2$O$_3$:Sn$_{0.10}$]:Zn$_y$, 0≤y≤0.10. The reported apparent densities were deduced by measuring the dimensions and the weights of the granules. It should be noted that the granules are prepared by pressing by hand the powder mixture in an alumina crucible. The data for In$_2$O$_3$:Zn have only been given by way of comparison. δ/2 indicates the neutral oxygen vacancy created by doping with Zn, the value of δ/2 varying with the Zn content.

TABLE I

| Sample identification | Starting mixture | Composition of the ceramic determined by EPMA ± 0.005 | ** |
|---|---|---|---|
| In$_2$O$_3$: Zn$_{0.02}$ | (In$_2$O$_3$)$_{0.99}$ + (ZnO)$_{0.02}$ | In$_{1.986}$Zn$_{0.014}$O$_{2.993-\delta/2}$ | 3.03 |
| In$_2$O$_3$: Sn$_{0.10}$ (ITO) | (In$_2$O$_3$)$_{0.95}$ + (SnO$_2$)$_{0.1}$ | In$_{1.910}$Sn$_{0.090}$O$_3$ | 2.52 |
| [In$_2$O$_3$: Sn$_{0.10}$]: Zn$_{0.04}$ | [(In$_2$O$_3$)$_{0.95}$ + (SnO$_2$)$_{0.1}$]$_{0.98}$ + (ZnO)$_{0.04}$ | In$_{1.856}$Sn$_{0.089}$Zn$_{0.045}$O$_{3-\delta/2}$ | 3.50 |
| [In$_2$O$_3$: Sn$_{0.10}$]: Zn$_{0.06}$ | [(In$_2$O$_3$)$_{0.95}$ + (SnO$_2$)$_{0.1}$]$_{0.97}$ + (ZnO)$_{0.05}$ | In$_{1.847}$Sn$_{0.091}$Zn$_{0.063}$O$_{3-\delta/2}$ | 3.92 |
| [In$_2$O$_3$: Sn$_{0.10}$]: Zn$_{0.08}$ | [(In$_2$O$_3$)$_{0.95}$ + (SnO$_2$)$_{0.1}$]$_{0.96}$ + (ZnO)$_{0.08}$ | In$_{1.827}$Sn$_{0.090}$Zn$_{0.083}$O$_{3-\delta/2}$ | 4.87 |
| [In$_2$O$_3$: Sn$_{0.10}$]: Zn$_{0.10}$ | [(In$_2$O$_3$)$_{0.95}$ + (SnO$_2$)$_{0.1}$]$_{0.95}$ + (ZnO)$_{0.10}$ | In$_{1.812}$Sn$_{0.090}$Zn$_{0.098}$O$_{3-\delta/2}$ | 6.57 |

** Apparent density (g/cm$^3$) ± 0.05

Figure 11:
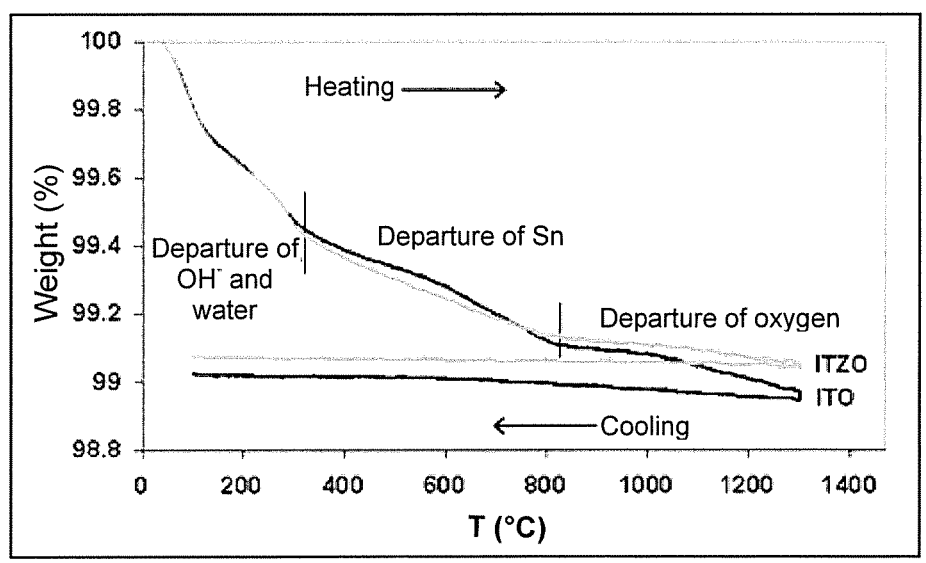
FIG. 11 represents thermogravimetric analysis (TGA) data for $In_2O_3:Sn_{0.10}$ (ITO) and $[In_2O_3:Sn_{0.10}]:Zn_{0.10}$ (ITZO) (nominal composition).

These results are confirmed by thermogravimetric analysis (TGA) obtained for the ITO and ITZO ceramics (FIG. 11). A small weight loss (0.28 wt % for [In$_2$O$_3$:Sn$_{0.10}$]:Zn$_{0.10}$ and 0.35 wt % for In$_2$O$_3$:Sn$_{0.10}$) is observed between 340° C. and 800° C. corresponding to the departure of Sn. Furthermore, a weight loss (~0.6 wt %) is observed between ambient temperature and ~340° C. which is linked to the release of water (adsorbed water and hydroxyl groups). Finally, the slight weight loss observed for the temperatures above 820° C. may be attributed to a partial departure of oxygen. However, a small weight gain is observed, mainly for ITO, during the cooling of the ceramics, probably due to a partial re-oxidation (FIG. 11).

Figure 12:
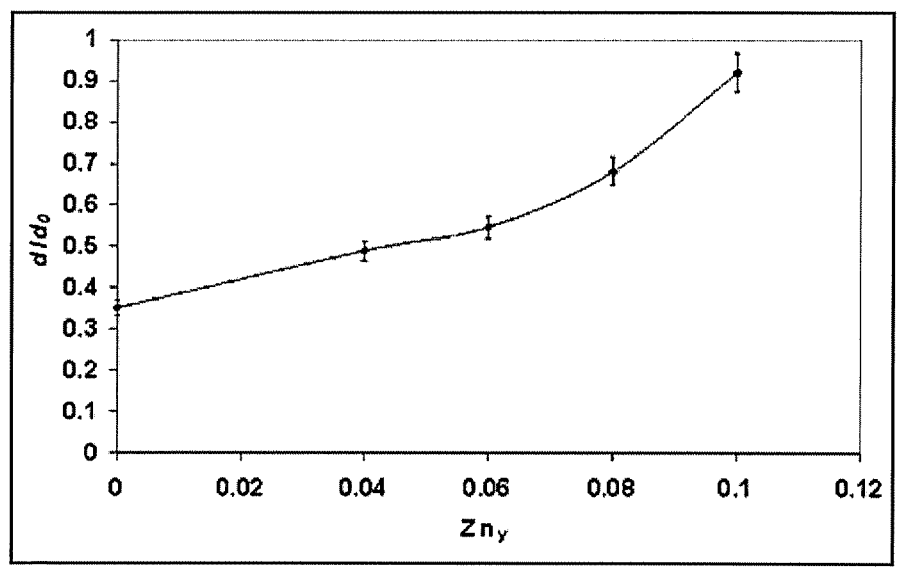
FIG. 12 represents a variation of the relative apparent density ($d/d_0$) with $Zn_y$ for the $[In_2O_3:Sn_{0.10}]:Zn_y$ ceramics.

The IZO ceramic having the nominal composition In$_2$O$_3$:Zn$_{0.02}$ (Table I) has a low density: ~3.03 g/cm$^3$; it corresponds to only 42% of the theoretical density of In$_2$O$_3$. This indicates that the concentration of Zn in IZO, corresponding to the solubility limit of Zn in In$_2$O$_3$, is not sufficient to induce a high densification when the granule is prepared by the method in question (pressed by hand) [36]. However, for the ITZO ceramics, it has emerged that the apparent density increases from 2.52 to 6.57 g/cm$^3$ (reaching 92% of the theoretical density) when the Zn concentration increases from 4-10 mol % [37]. From Table I and FIG. 12, the highest density is observed for the ceramic co-doped with almost equal amounts of Zn and Sn (around 10 mol %). The improvement in the density must be correlated to the presence of Zn$^{2+}$ in the substitutional position (as occurs for AZTO ceramics [38]), which leads to the formation of neutral oxygen vacancies (δ/2) according to:

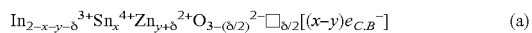

$$\text{In}_{2-x-y-\delta}^{3+}\text{Sn}_x^{4+}\text{Zn}_{y+\delta}^{2+}\text{O}_{3-(\delta/2)}^{2-}\square_{\delta/2}[(x-y)e_{C.B}^-] \quad (a)$$

Specifically, as was observed for AZTO, the neutral oxygen vacancies promote mass transfer at the grain boundary resulting from the densification of the ceramic. However, the presence of Zn$^{2+}$ in the substitutional position will compensate for the free carriers produced by the doping with Sn$^{4+}$ [according to the formula (a)] resulting from the net charge concentration per unit of formula equal to "x-y".

Figure 13:
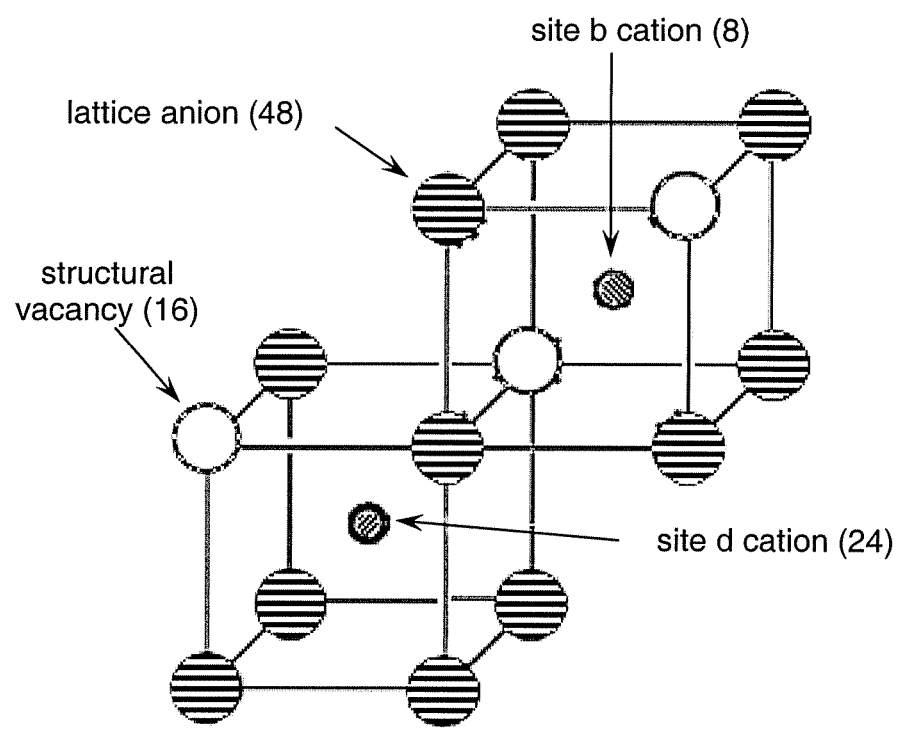
FIG. 13 is a schematic representation of site b cations and of site d cations in the bixbyite-type structure, with lattice anions and structural vacancies.

Structural characterization—Indium oxide has the bixbyite-type cubic structure (also known as c-type rare-earth oxide structure) which has a unit cell of 80 atoms (In$_{32}$O$_{48}$) with the space group Ia3 and a lattice parameter equal to 10.117 Å [39]. This structure may be derived from the structure related to fluorite (CaF$_2$) by removing a quarter of the anions and by allowing small changes of the ions [40]. The indium cations are located at two non-equivalent sextuple positions, referred to as "b" and "d" (FIG. 13). The site b cations (8) are bonded by two structural vacancies along the diagonal of the cube. The site d cations (24) are bonded by two structural vacancies along the diagonal of one face. It should be noted that these structural vacancies (16) are in fact free interstitial oxygen positions.

Figure 14:
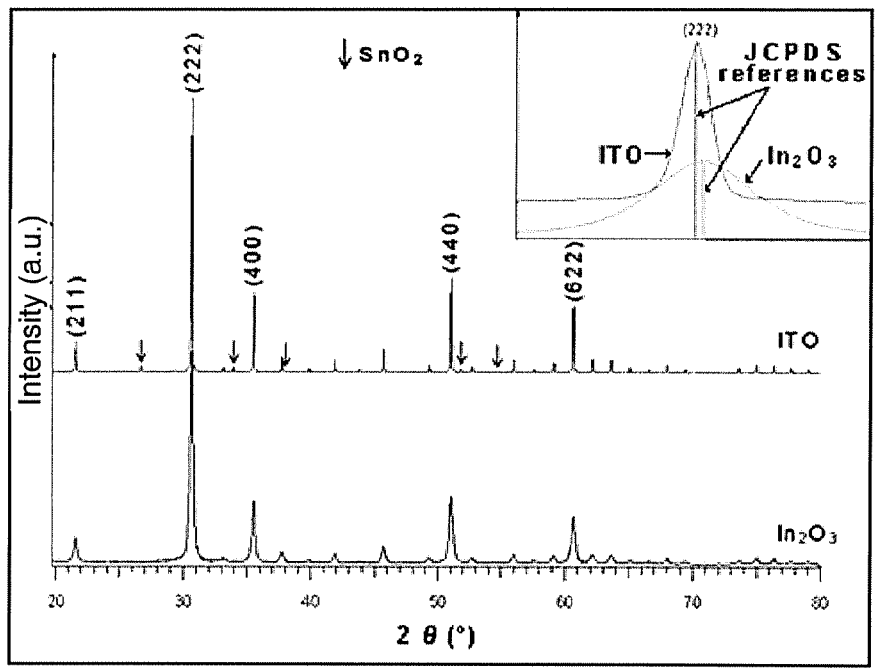
FIG. 14 represents X-ray diffraction pattern data for (a) undoped $In_2O_3$ and (b) $In_2O_3:Sn_{0.01}$ (ITO) powders annealed at 1300° C., the change in the ITO peak (222) being shown in the insert, ($\downarrow$) indicating the peaks that correspond to rutile $SnO_2$.

ITO (In$_2$O$_3$:Sn)—The X-ray diffraction patterns for In$_2$O$_3$ and ITO (nominal composition In$_2$O$_3$:Sn$_{0.10}$) powders annealed at 1300° C. are shown in FIG. 14. For ITO, several peaks of extra-low intensity are observed that correspond to rutile SnO$_2$, in addition to peaks characteristic of the bixbyite-type structure of ITO (JCPDS 89-4596 reference diagram). The ratio between the ITO peak of highest intensity and the SnO$_2$ peak of highest intensity is 1/~0.03. This is due to the solubility limit of SnO$_2$ in In$_2$O$_3$ (6 mol %) at 1300° C., as has been demonstrated by Enoki et al. [35, 36]. Furthermore, a pronounced decrease in the full width at half maximum (FWHM) of the peaks for the ITO powder compared to In$_2$O$_3$ (JCPDS 71-2194 reference diagram) is observed, indicating an improvement in the crystallinity for doped In$_2$O$_3$. For example, when considering the peak (222), which is the most intense peak, it emerges that the full width at half maximum decreases from 0.278 for In$_2$O$_3$ to 0.083 for ITO. This improvement in the crystallinity seems to be linked to the increase in the carrier concentration for In$_2$O$_3$ doped with tin (Sn). A similar observation has also been reported previously for ATO. Finally, a slight change in the main diffraction peaks of ITO is noted toward smaller angles compared to pure In$_2$O$_3$ (FIG. 14), which takes into account a slight increase in the unit cell parameter of from 10.117 Å for In$_2$O$_3$ to 10.123 Å for ITO. This behavior is not expected when considering the substitution of one part of In$^{3+}$ by Sn$^{4+}$ because Sn$^{4+}$ has an ionic radius (0.69 Å) which is smaller than In$^{3+}$ (0.80 Å) [41]. Thus, the increase in the cell parameter could be linked to the high electron carrier concentration in the conduction band and/or to the presence of cations in interstitial positions.

Figure 5:
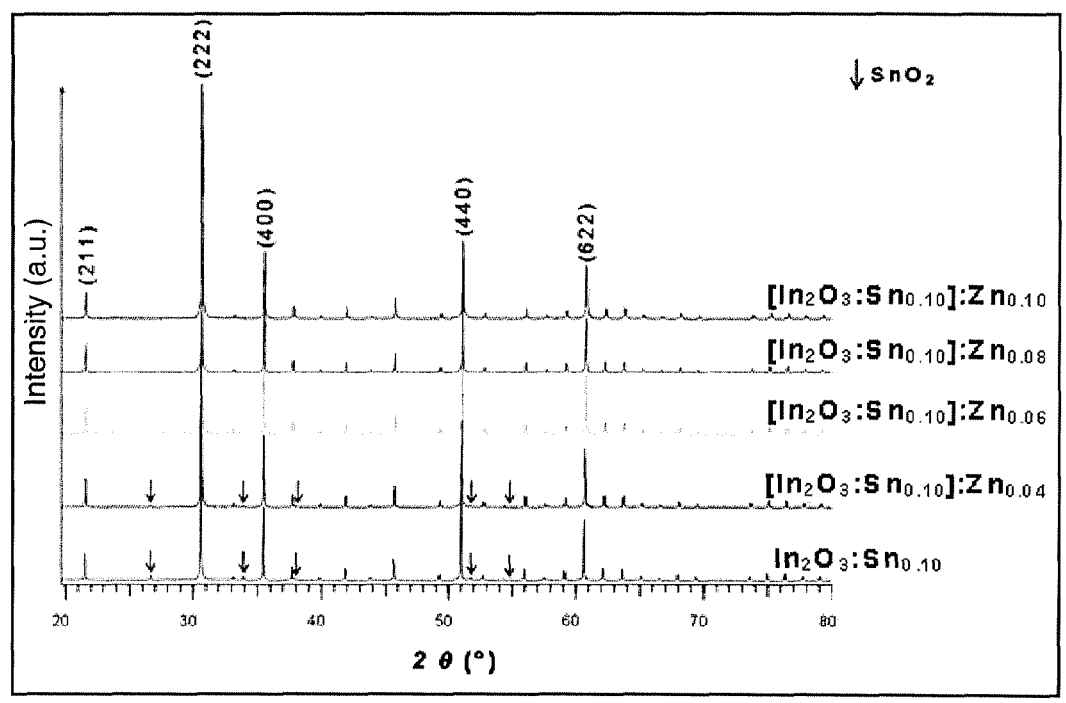
FIG. 5 is an X-ray diffraction pattern for the sintered ITZO powders having the nominal composition $[In_2O_3:Sn_{0.10}]:Zn_y$, $0 \le y \le 0.10$, ($\downarrow$) indicating the peaks that correspond to rutile $SnO_2$.

ITZO (In$_2$O$_3$:Sn:Zn)—The X-ray diffraction pattern for the ITZO powders sintered (annealed according to GDT) at 1300° C. (FIG. 5) shows that they are very well crystallized and that they adopt the bixbyite structure of ITO. No supplementary peak corresponding to the structures ZnO$_x$ or Zn$_k$In$_2$O$_{3+k}$ is observed when the Zn content is increased up to 10 mol %. Nevertheless, it emerges that the minor peaks characteristic of the SnO$_2$ structure observed with those of the ITO structure gradually disappear with an increase of the Zn content up to a value of y=6 mol %. This confirms the increase in solubility for both Zn and Sn when they are co-doped in In$_2$O$_3$ [25, 36]. Specifically, the increase in the solubility is attributed to the isovalent substitution of two In$^{3+}$ by one Zn$^{2+}$ and one Sn$^{4+}$. A slight increase in FWHM is also observed during the increase of the Zn content. This change is very probably due to the reduction in the carrier concentration with the increase of Zn (as will be shown later). Finally, a displacement of the main peaks of the diffraction is noted toward a higher angle which increases with the Zn content (FIG. 6), inducing a reduction in the cell parameter 'a' (Table II). This change should be attributed to the existence of $Zn^{2+}$ in substitution positions increasing with the Zn content as has already been suggested in the formula (a) above. In fact, the $Zn^{2+}$ that is coordinated (six times) has an ionic radius (0.74 Å) which is smaller than that of $In^{3+}$ (0.80 Å) [41].

Table II presents the change in the cell parameter with the Zn content for sintered ITZO powders. The ITO cell parameter is added as a reference.

TABLE II

| Sample identification | a (Å) |
|---|---|
| $In_2O_3$: $Sn_{0.10}$ (ITO) | 10.123 |
| [$In_2O_3$: $Sn_{0.10}$]: $Zn_{0.04}$ | 10.114 |
| [$In_2O_3$: $Sn_{0.10}$]: $Zn_{0.06}$ | 10.107 |
| [$In_2O_3$: $Sn_{0.10}$]: $Zn_{0.08}$ | 10.104 |
| [$In_2O_3$: $Sn_{0.10}$]: $Zn_{0.10}$ | 10.097 |

The change in the surface morphology of the ceramic with the Zn content is presented in the SEM micrographs (FIG. 7A-D). It has been found that when the Zn content increases in the ceramic, the grain percolation increases and the porosity decreases. This confirms the gradual increase of the density with the Zn content (see Table I and FIG. 12). The highest density (~6.57) was observed for the ceramic which has a nominal Zn content of 10 mol % ([$In_2O_3$:$Sn_{0.10}$]:$Zn_{0.10}$), which has almost complete grain percolation (FIG. 7A-D). In fact the co-doping of $In_2O_3$ with Zn and Sn leads to the presence of neutral oxygen vacancies (δ/2) according to:

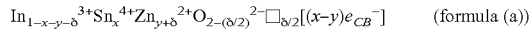

(formula (a))

which allows a mass transfer to the grain boundaries and thus to the grain percolation, resulting in an increase of the ceramic density [37].

Figure 8:
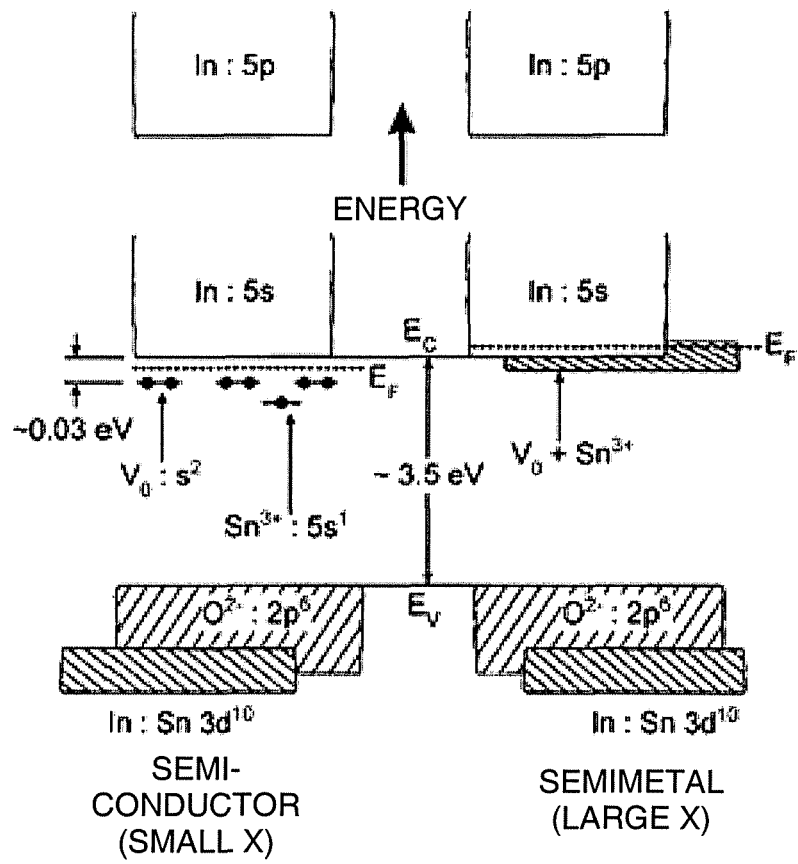
FIG. 8 represents a schematic model of the energy band for Sn which dopes $In_2O_3$ for a small and large doping concentration (x) (according to the estimate in document [11] in which 0.015 mol % is a threshold value).

Electrical measurements—$In_2O_3$ is a non-stoichiometric n-type semiconductor or even semimetal, with a wide energy band of semiconductor or even semimetal "gap" (≈3.5 eV) for high doping levels. The origin of such conductivity is due to the charged oxygen vacancy ($V_o$) and/or to the doping with $Sn^{4+}$. Fan and Goodenough [11] developed a model that shows that the bottom of the conduction band is essentially composed of In:5s states and the top of the valence band is composed of O:2p states (FIG. 8).

Figure 9:
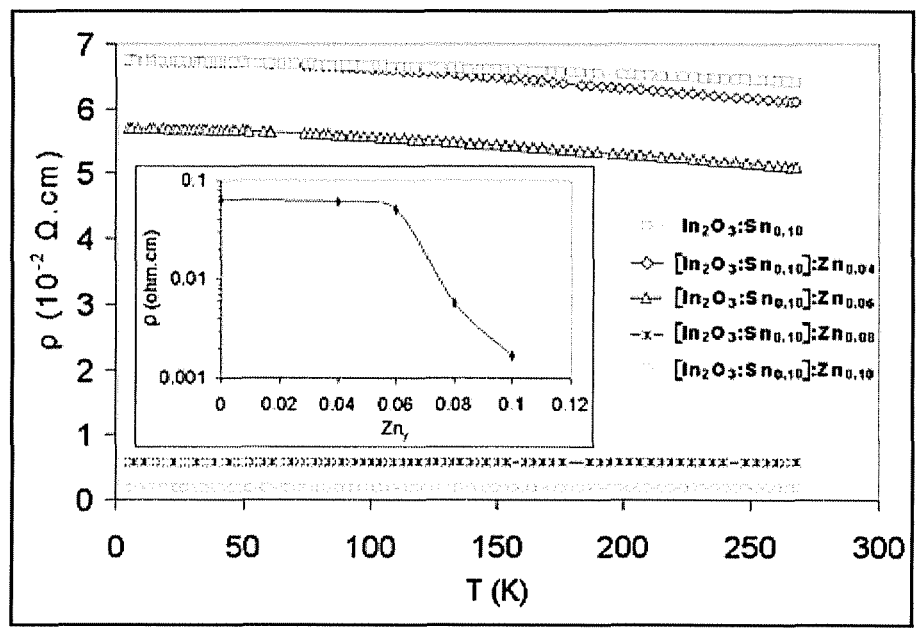
FIG. 9 represents the change in the resistivity with temperature for various nominal Zn contents ($Zn_y$) in the ITZO ceramic ($[In_2O_3:Sn_{0.10}]:Zn_y$) with $0 \le y \le 0.10$, the change in the resistivity at ambient temperature being shown in the insert.
Figure 10:
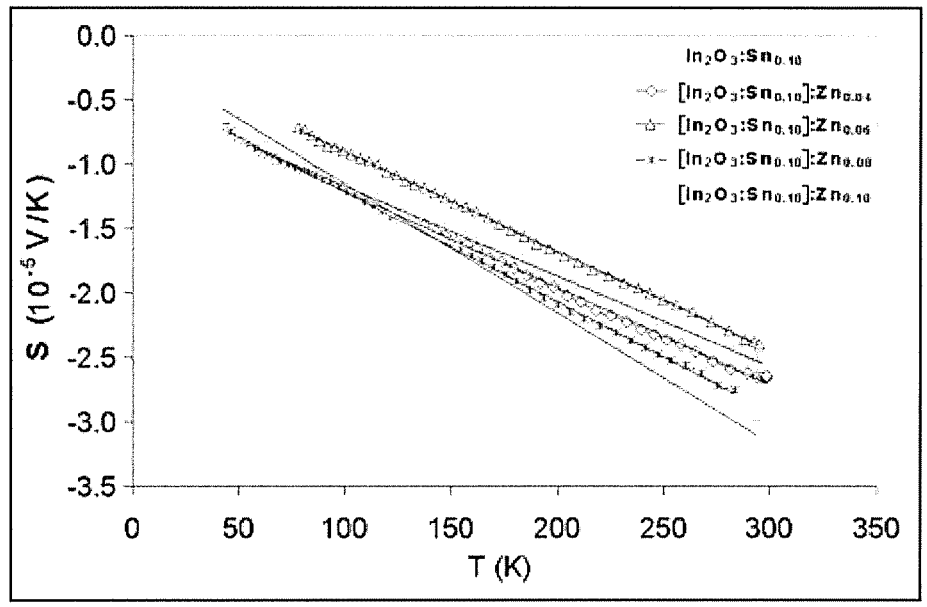
FIG. 10 represents the change in the Seebeck coefficient with temperature for various nominal Zn contents in the ITZO ceramic ($[In_2O_3:Sn_{0.10}]:Zn_y$) with $0 \le y \le 0.10$.

The ITZO ceramics demonstrate electrical resistivities that are lower compared with that of ITO (FIG. 9). It gradually decreases with the Zn content and reaches its minimum (~1.7×10⁻³ Ω·cm) for the ceramic which nominally contains 10 mol % of Zn. This is partially due to the difference in ceramic density reported previously (Table I). Specifically, the lowest resistivity is observed for a ceramic which has the highest density. A semiconductor behavior is also observed for the three ceramics having the highest resistivity (the highest resistivities), which could be connected to the low density observed for these ceramics that probably induce low mobility. Charge carrier concentrations of the ceramic have been deduced from Seebeck measurements carried out at low temperature (using the "Electron Transport Measurement" of ICMCB) (FIG. 10). Firstly, the energy difference was deduced between the conduction band and the Fermi energy level between $|E_F-E_c|$ from the slope (FIG. 10) using the following equation:

$$S \approx -\frac{k_B}{e} \frac{\pi^2}{|E_F - E_C|} k_B T \tag{1}$$

in which S is the Seebeck coefficient measured in V/K. The charge carrier concentration may then be deduced using the following equation for a degenerate semiconductor:

$$E_F - E_C = \frac{h^2}{2m^*}\left(\frac{3N}{8\pi}\right)^{2/3} \tag{2}$$

Figure 6:
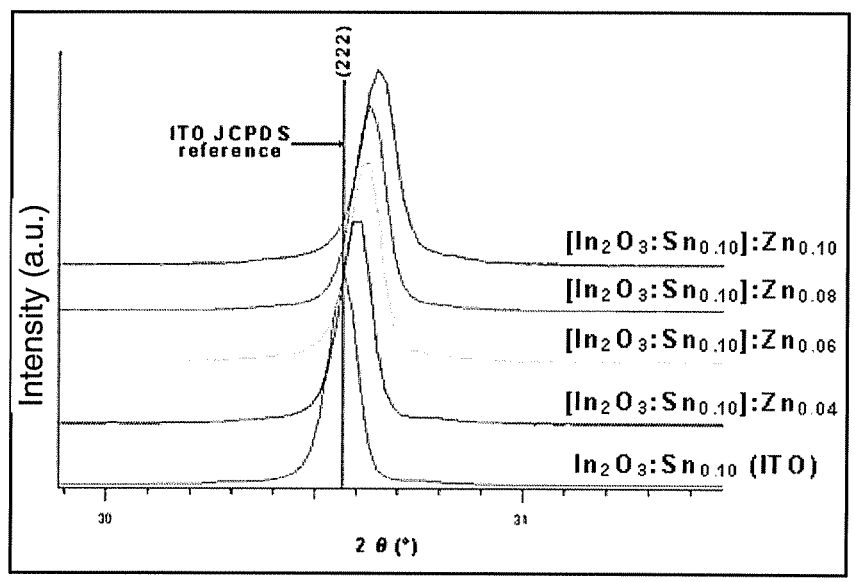
FIG. 6 shows the displacement of the X-ray peak (222) for the sintered ITZO powders in comparison with the ITO equivalent (JCPDS 89-4596 reference pattern).
Figure 7A:
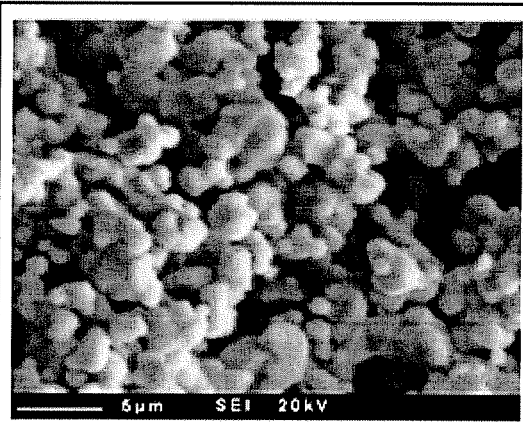
FIGS. 7A, 7B, 7C and 7D represent SEM micrographs for the ceramics that have the following nominal compositions: (7A) $In_2O_3:Sn_{0.10}$; (7B) $[In_2O_3:Sn_{0.10}]:Zn_{0.04}$; (7C) $[In_2O_3:Sn_{0.10}]:Zn_{0.08}$; and (7D) $[In_2O_3:Sn_{0.10}]:Zn_{0.10}$.
Figure 7B:
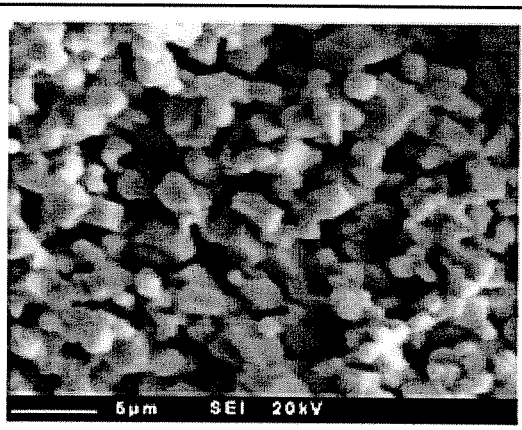
Figure 7C:
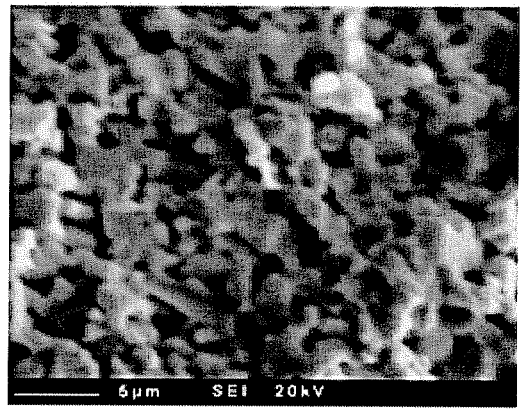
Figure 7D:
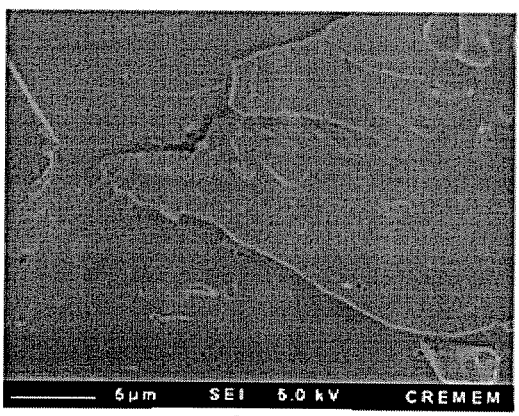

N is the charge carrier concentration and m* is the effective mass of the electron (the assumption was made that m* is equal to 0.4 $m_e$ [42]). All the electrical data deduced from Seebeck and the resistivity measurements are listed in Table III. At first, the charge concentration decreases with the amount of Zn in the ceramic. This may be explained by the increase in the substitution of $In^{3+}$ by $Zn^{2+}$ in the $In_2O_3$ structure, which is confirmed by the displacement toward a higher angle of the various peaks of the XRD (X-ray diffraction) patterns (FIG. 6). However, a high increase in the charge mobility is observed when the Zn content increases. The increase in the mobility corresponds to the large increase in grain percolation (FIGS. 7A-D) and consequently in the ceramic density [36, 37]. Thus, a low mobility is obtained for ceramics having a semiconductor behavior (FIG. 9) whereas a high mobility (at least 10 times higher) is observed for a ceramic having a metallic behavior (FIG. 9).

Table III presents the values of $E_F$–$E_c$, of the mobility, of the charge concentration and of the resistivity for the ITO ceramics and various ITZO ceramics. The charge concentration was deduced using the Seebeck coefficient measurements.

TABLE III

| Sample identification | $E_F$-$E_C$ (eV) | Charge mobility ($cm^2V^{-1}s^{-1}$) ± 5% | Charge concentration (×10²⁰ $e^-$ $cm^{-3}$) ± 5% | Resistivity (10⁻³ Ω · cm) ± 5% |
|---|---|---|---|---|
| $In_2O_3$: $Sn_{0.10}$ (ITO) | 0.67 | 0.16 | 6.30 | 64 |
| [$In_2O_3$: $Sn_{0.10}$]: $Zn_{0.04}$ | 0.62 | 0.18 | 5.63 | 61 |
| [$In_2O_3$: $Sn_{0.10}$]: $Zn_{0.06}$ | 0.61 | 0.23 | 5.42 | 51 |
| [$In_2O_3$: $Sn_{0.10}$]: $Zn_{0.08}$ | 0.55 | 2.30 | 4.68 | 5.8 |
| [$In_2O_3$: $Sn_{0.10}$]: $Zn_{0.10}$ | 0.47 | 10.09 | 3.65 | 1.7 |

Using the EPMA results and the electrical measurements, it is possible to calculate the exact final formula for the ITO and ITZO ceramics. In the case of the ITO ceramic, there is only a substitution of $In^{3+}$ by $Sn^{4+}$ in the $In_2O_3$ lattice producing free electron carriers in the conduction band according to the formula:

(B)

x was deduced from the charge carrier concentration (Table III) and found to be equal to ~0.04 per unit of formula. Thus, the following formula for ITO should normally be written:

$$In_{1.96}^{3+}Sn_{0.04}^{4+}O_3^{2-}[0.04e_{C.B.}^-] \quad (C)$$

However, the formula (c) differs from that determined using EPMA: $In_{1.91}Sn_{0.09}O_3$ which is more precise. In fact, it is recalled that the amount 0.09 Sn is divided into three parts: (i) one part will go to form the additional rutile $SnO_2$ phase as shown previously by the XRD (X-ray diffraction) analysis, (ii) another part substitutes $In^{3+}$ producing free electrons in the conduction band according to the formula (c) and (iii) the remaining Sn are very probably segregated at the grain boundaries when structural disorder predominates.

For ITZO, both $Sn^{4+}$ and $Zn^{2+}$ substitute $In^{3+}$ in $In_2O_3$ according to the formula (a)

$$(In_{2-x-y-\delta}^{3+}Sn_x^{4+}Zn_{y+\delta}^{2+}O_{3-(\delta/2)}^{2-}\square_{\delta/2}[(x-y)e_{C.B.}^-]).$$

The parameters calculated (x, y and δ) and the corresponding final formula for the ITZO ceramics are listed in Table IV.

Table IV presents the parameters and final formula for ITZO calculated using the EPMA results and charge concentration determined by the Seebeck measurements.

TABLE IV

| Sample identification | x | y | δ | Final formula |
|---|---|---|---|---|
| $[In_2O_3: Sn_{0.10}]: Zn_{0.06}$ | 0.091 | 0.057 | 0.006 | $In_{1.847}^{3+}Sn_{0.091}^{4+}Zn_{0.063}^{2+}O_{2.997}^{2-}\square_{0.003}[(0.034)e_{C.B.}^-]$ |
| $[In_2O_3: Sn_{0.10}]: Zn_{0.08}$ | 0.092 | 0.062 | 0.020 | $In_{1.826}^{3+}Sn_{0.092}^{4+}Zn_{0.082}^{2+}O_{2.990}^{2-}\square_{0.010}[(0.030)e_{C.B.}^-]$ |
| $[In_2O_3: Sn_{0.10}]: Zn_{0.10}$ | 0.090 | 0.066 | 0.032 | $In_{1.812}^{3+}Sn_{0.090}^{4+}Zn_{0.098}^{2+}O_{2.984}^{2-}\square_{0.016}[(0.024)e_{C.B.}^-]$ |

Conclusions—The granules of the ITO, IZO and ITZO ceramics were prepared without using a hot or cold pressing procedure. They were obtained simply by mixing lightly pressed (pressed by hand) powder in a cylindrical crucible made of alumina and then by sintering at 1300° C. The idea was to be capable of preparing large-scale targets that could be used for industrial applications in a vapor phase deposition process.

It has been found that the final composition of the IZO ceramic has a Zn content of ~1.4 mol %, which corresponds to the solubility limit in $In_2O_3$. The density of the IZO ceramic obtained is low (~3.03 g/cm³) compared to the theoretical density of $In_2O_3$ (7.16 g/cm³). For the ITO ceramic, a good agreement between the final composition of the ceramic and the starting mixture was observed with a very small loss of $Sn^{4+}$ (~1 mol %) and its density is low (35% of the theoretical density). For ITZO, the final compositions of the ceramic are also in good agreement with their starting mixtures, also with a very small loss of $Sn^{4+}$ (~0.5-1 mol %). However, the density of the ITZO ceramic prepared gradually increases when the Zn content increases, due to the increase of neutral oxygen vacancies that promote mass transfer to the grain boundaries and, in this way, facilitate the percolation between the grains. The highest density (~92% of the theoretical density) is observed for the ceramic having the nominal composition $[In_2O_3:Sn_{0.10}]:Zn_{0.10}$.

In good agreement with the literature [35], the solubility of $SnO_2$ in $In_2O_3$ reached ~6 mol % as was shown on the X-ray diffraction patterns. However, it emerges that the solubility of Sn and Zn increases when they co-substitute In in $In_2O_3$. Specifically, this was shown by the X-ray diffraction pattern analysis. An additional peak corresponding to Sn or Zn oxide phases was not observed for the ceramics having a Zn content ≥6 mol %. Furthermore, the small change of the peaks from the X-ray diffraction pattern toward higher angles takes into account the reduction in the cell parameter due to the substitution of some $In^{3+}$ by $Zn^{2+}$.

More advantageously, the electrical resistivities of the ITZO ceramics are lower than those of their ITO homolog due to a higher density and a lower porosity and consequently to a higher mobility. The lowest resistivity (~1.7×10⁻³ Ω·cm) was observed for that having the nominal composition $[In_2O_3:Sn_{0.10}]:Zn_{0.10}$. To conclude, by using the simple sintering of a lightly pressed mixed ITZO powder, a highly dense and conductive ceramic has successfully been prepared, which is suitable for sputtering. It is recalled that the nominal composition $[In_2O_3:Sn_{0.10}]:Zn_{0.10}$ corresponds to the initial powder mixture:

$$[(In_2O_3O_3)_{0.95}+(SnO_2)_{0.1}]_{0.95}+(ZnO)_{0.10}$$

This mixture will be used for preparing a ceramic target which is suitable for depositing a thin film via the sputtering technique.

Thin films—ITZO thin films were deposited using the RF sputtering deposition technique. The sputtering machine (Leybold L560) which was previously used for the deposition of ATO and AZTO thin films was used.

This work was carried out in collaboration with J. P. Manaud, from the "Centre de Ressources Couches Minces de l'ICMCB" (Thin Film Resource Center of ICMCB).

Target preparation—An ITZO ceramic target having a diameter of 50 mm was prepared using the optimized ceramic composition. A batch of 50 g of appropriate amounts of $In_2O_3$, $SnO_2$ and ZnO powders were milled using balls for 3 hours in an agate bowl containing agate balls and ethanol. Then, after evaporation of the ethanol, the powder was ground in an agate mortar, and then a cylindrical crucible made of alumina having a diameter of 82.56 mm was filled with the powder (see FIG. 15A-D).

The powder mixture in the crucible was lightly pressed (by hand) and then sintered at 1300° C. in air for 12 hours. The ITZO ceramic target having a relative density of ~0.92 was then obtained. It emerged that the diameter of the target was ~52.5 mm after heat treatment which corresponds to ~36.4% shrinkage in the diameter due to the densification process. The target having a final diameter of 50 mm was obtained after polishing.

Optimized sputtering parameters—By using the target already prepared, the ITZO thin films were deposited by RF magnetron sputtering in a sputtering chamber equipped with a turbopump (Leybold L560). After depositing the films, the pressure of residual gases was around 5-9×10⁻⁵ Pa. Before each deposition process a pre-sputtering was carried out systematically for 20 min for the purpose of cleaning the surface of the target. The deposition of the films was carried out at ambient temperature without heating the substrate. They were deposited onto substrates made of glass or made of PET (polyethylene terephthalate), over various deposition times. The RF power density for the deposition was varied from 0.5 to 2.5 W/cm². This was carried out at a total gas pressure set at 1 Pa under a mixture of argon (99.999%) and oxygen (99.99%), with a partial pressure of oxygen varying between 0 and 2%.

For the purpose of having films with good optoelectronic properties, the sputtering conditions were first optimized. After that, the influence was studied of the power density (P) and the partial pressure of oxygen ($p_{O2}$) on the deposition rate, on the optical and electrical properties of the ITZO thin films [43]. In order to have sputtered particles of low energy (which are suitable for a PET substrate), the distance from the target to the substrate ($d_{t-s}$) was set at 7 cm, which is the maximum distance that makes it possible to maintain the plasma in the sputtering chamber having a low sputtering power density of 0.5 W/cm$^2$.

Figure 17:
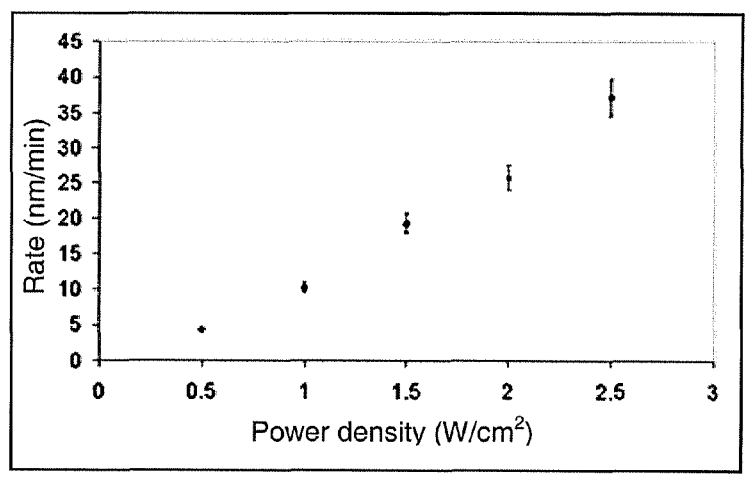
FIG. 17 represents the influence of the power density on the deposition rate of ITZO thin films ($p_{O2}$=0.2%).

Influence of the sputtering parameters on the deposition rate—The determination of the deposition rate was carried out, as is customary, by depositing a film for a certain period of time onto the glass substrate and then by measuring the thickness of the film using a profilometer. According to FIG. 17, the fact of increasing the power density from 0.5 to 2.5 W/cm$^2$ in an almost linear manner increases the deposition rate from 4.3 to 37.2 nm/min. Specifically, a higher power density induces a higher plasma density and the transfer of momentum toward the target. However, it is chosen not to exceed higher power densities because the main objective of this study is to deposit ITZO films on plastic substrates.

Figure 18:
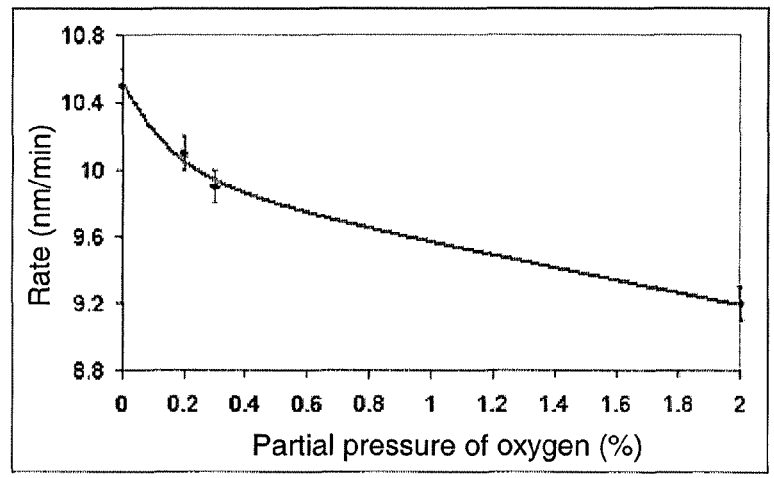
FIG. 18 represents the partial pressure of oxygen on the deposition rate of ITZO thin films (P=1 W/cm$^2$).

As expected, unlike the power density, the deposition rate decreases with an increase in the amount of oxygen in the plasma (FIG. 18). This may be connected either to the nature of the molecular ions present in the mixed plasma which have a lower mean free path leading to a lower probability that the particles will reach the substrate, or to the composition of the extreme surface of the target which varies depending on the nature of the plasma and may influence the deposition rate.

Figure 19:
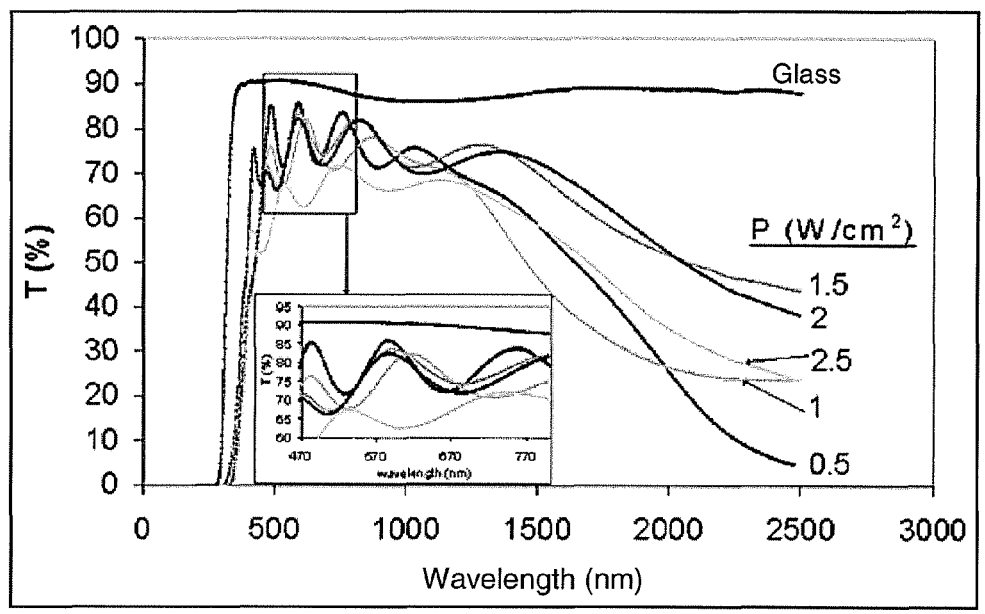
FIG. 19 represents the transparency spectrum for ITZO thin films deposited at various power densities ($p_{O2}$=0.2%), the film thickness being fixed at around 400 nm for all the films, the insert showing the extended visible region displaying transparency.

Influence of the sputtering parameters on the optical properties—FIG. 19 shows the change in the transmittance between 200 and 2500 nm as a function of the power density. The highest visible transparency (~86%) is obtained for thin films deposited on a glass substrate at a power density of 0.5 W/cm$^2$. However, the lowest transparency (~71%) is observed for samples deposited at the highest sputtering power density (2.5 W/cm$^2$). This is because, at a high power density, a "back sputtering" phenomenon may take place, causing structural defects in the film, the latter introducing hole subband energy states that lead to a reduction in the transparency of the film.

Figure 20:
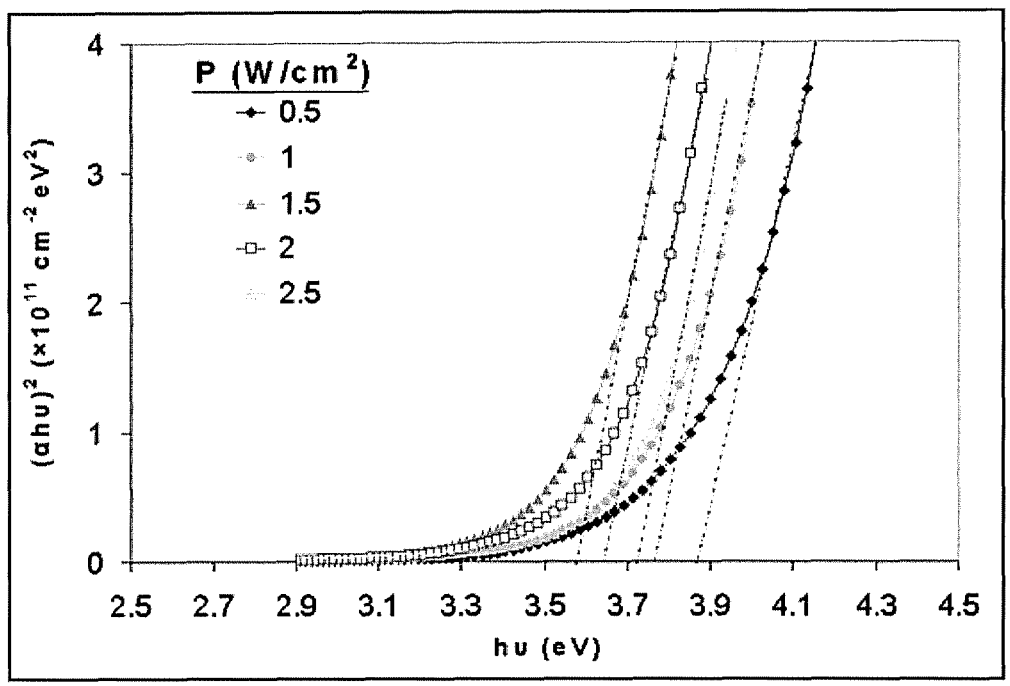
FIG. 20 represents the determination of the optical energy of the forbidden band for the ITZO thin film at various power densities.

The optical energy of the forbidden band ($E_g$) was determined by extrapolating the linear portion of the plotted curve (FIG. 20) to a zero absorption. $E_g$ of the ITZO films deposited decreases firstly from ~3.88 to ~3.57 eV when the power density increases from 0.5 to 1.5 W/cm$^2$ (FIG. 20). For power densities larger than 1.5 W/cm$^2$, an increase in $E_g$ is observed. The latter change is linked to the change in the carrier concentration (Burstein-Moss effect [44, 45]), as will be shown below.

Figure 21:
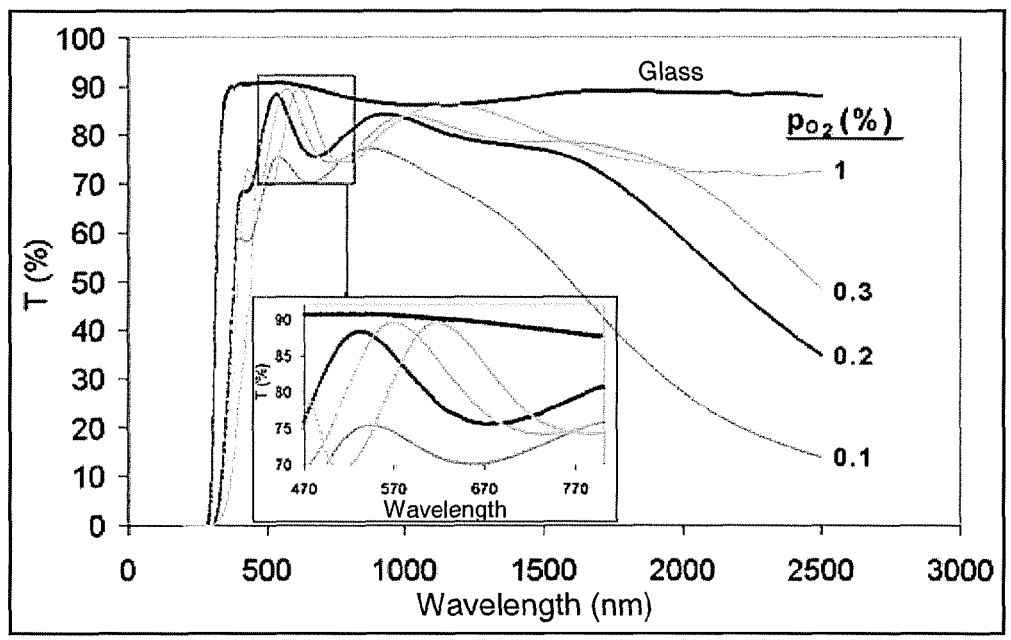
FIG. 21 represents the optical transmission for various thin films prepared under diverse partial pressures of oxygen (P=0.5 W/cm$^2$), the thicknesses of the films being between 250 and 280 nm.

The influence of the partial pressure of oxygen ($p_{O2}$) on the transmission was studied for thin films prepared under the lowest power density (0.5 W/cm$^2$) which give the best transparency in the visible range. A low visible transparency (~77%) was observed for the film deposited at $p_{O2}$=0.1% (insert from FIG. 21), of brown color. However, for films deposited at a partial pressure of oxygen $p_{O2}$ greater than 0.1, a high transparency is obtained, ranging from ~88.5 to ~89.5% for a partial pressure of oxygen between 0.2 and 1% and the films are almost colorless.

Figure 22:
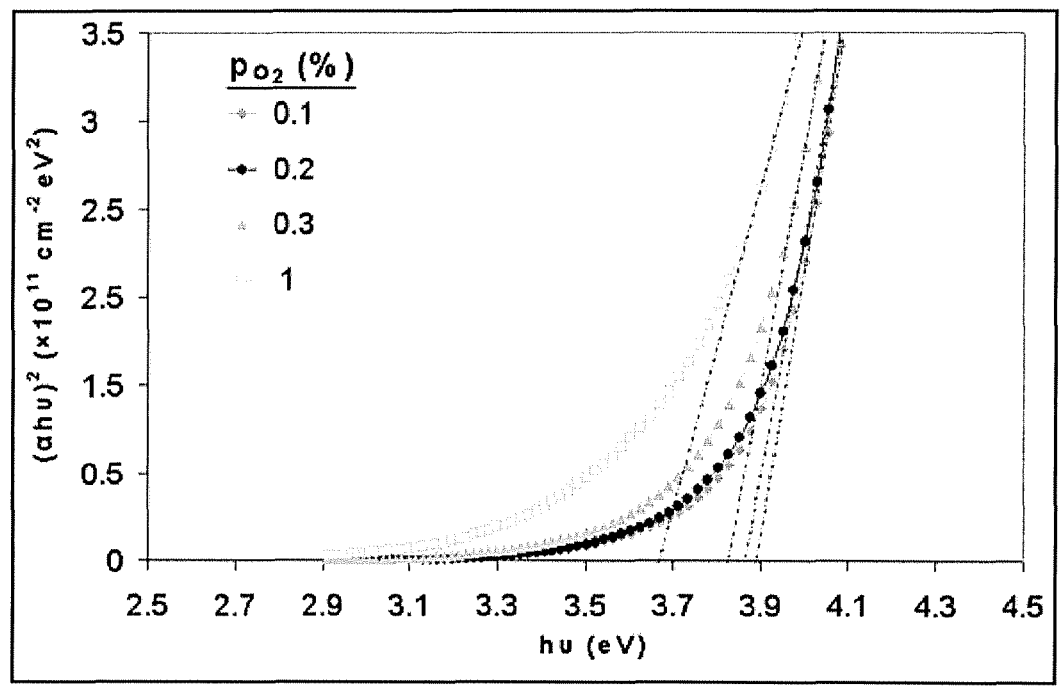
FIG. 22 represents the determination of the optical energy of the forbidden band for the ITZO thin film deposited under various partial pressures of oxygen.

$E_g$ decreases from around ~3.89 to ~3.66 eV when the partial pressure of oxygen in the sputtering chamber changes from 0.1 to 1% (FIG. 22). The increase in the partial pressure of oxygen favors the reduction in the oxygen vacancies ($\delta$) leading to a reduction in the carrier concentration [as will be seen later in the formula (d)].

Figure 23:
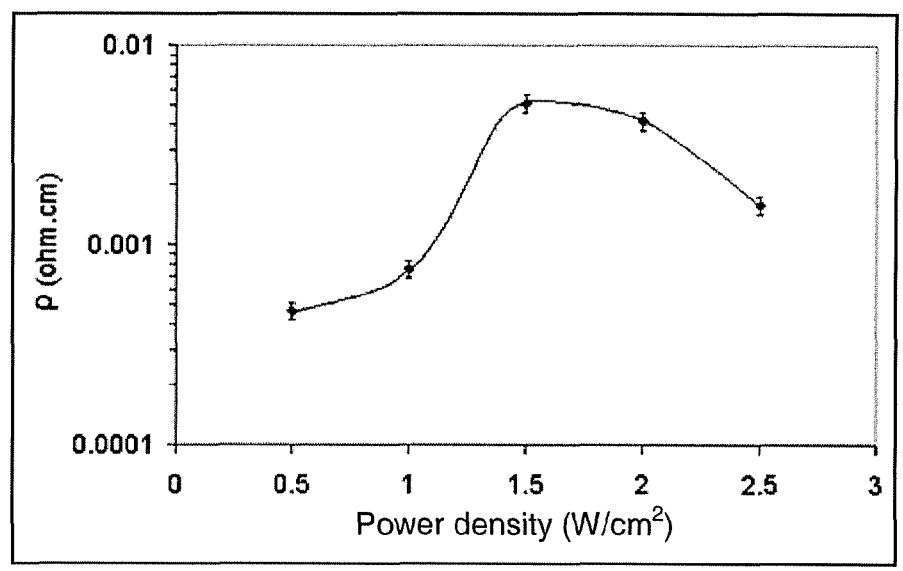
FIG. 23 represents the change in the resistivity with the power density ($p_{O2}$=0.2%).

Influence of the sputtering parameters on the electrical properties—Table V indicates the change in the carrier concentration, the mobility and the resistivity as a function of the power density. The resistivity of ITZO thin films increases gradually from ~4.6×10$^{-4}$ Ω·cm to ~5.1×10$^{-3}$ Ω·cm, when the power density increases from 0.5 W/cm$^2$ to 1.5 W/cm$^2$ (FIG. 23) and then decreases for a higher power density. This is because the resistivity is inversely proportional to the carrier concentration. However, as expected, the change in the mobility shows a reverse tendency to the carrier concentration even though the mobility has a minor contribution to the resistivity. It should be noted that the lowest resistivity is obtained for a power density of 0.5 W/cm$^2$.

Table V presents: Carrier concentration (determined from Hall measurements), mobility and resistivity for various ITZO thin films deposited at various power densities.

TABLE V

| Power density (W/cm$^2$) | Carrier concentration (×10$^{20}$ e$^-$ cm$^{-3}$) ± 5% | Mobility (cm$^2$/V·s) ± 5% | Resistivity (×10$^{-3}$ Ω·cm) ± 5% |
|---|---|---|---|
| 0.5 | 5.54 | 24.1 | 0.46 |
| 1 | 2.82 | 29.1 | 0.76 |
| 1.5 | 0.331 | 36.8 | 5.1 |
| 2 | 0.67 | 21.6 | 4.2 |
| 2.5 | 2.11 | 18.7 | 1.6 |

The change in the resistivity was monitored as a function of the partial pressure of oxygen for ITZO thin films deposited at a power density of 0.5 W/cm$^2$.

Figure 24:
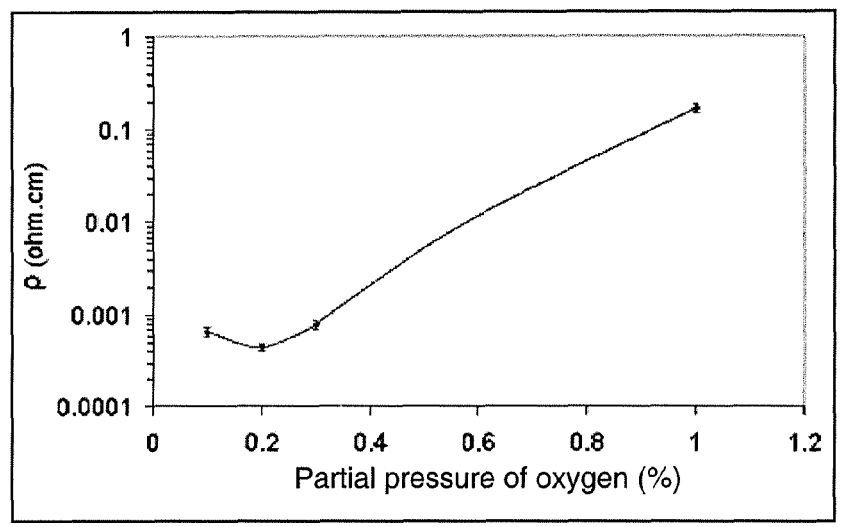
FIG. 24 represents the change in the resistivity as a function of the partial pressure of oxygen for the thin films (P=0.5 W/cm$^2$).

The values of the carrier concentration, of the mobility and of the resistivity for various partial pressures of oxygen are collated in Table VI. The lowest resistivity (~4.4×10$^{-4}$ Ω·cm) is obtained for the films deposited at $p_{O2}$=0.2% (FIG. 24). For films deposited at lower $p_{O2}$ (0.1%), the carrier concentration corresponds to the highest value (Table VI) which explains the low transparency (FIG. 21) and the highest $E_g$ (FIG. 22). Nevertheless, the mobility is lower than that of the films deposited at $p_{O2}$=0.2% (Table VI), which explains the higher resistivity. For films deposited at $p_{O2}$ greater than 0.2%, the carrier concentration decreases with $p_{O2}$. Furthermore, the mobility also decreases with $p_{O2}$, which may be due to a structural disorder induced by the insertion of oxygen in the amorphous structure which will be demonstrated below. Consequently, the resistivity of the film increases radically (~1.7× 10$^{-1}$ Ω·cm) when it is deposited at high $p_{O2}$ (1%).

Table VI presents: Carrier concentration determined by Hall measurement, calculated mobility, and resistivity measured for various ITZO thin films deposited at various partial pressures of oxygen.

TABLE VI

| Partial pressure of oxygen (%) | Carrier concentration (×10$^{20}$ e$^-$ cm$^{-3}$) ± 5% | Mobility (cm$^2$/V·s) ± 5% | Resistivity (Ω·cm) ± 5% |
|---|---|---|---|
| 0.1 | 5.36 | 17.8 | 6.55 × 10$^{-4}$ |
| 0.2 | 4.89 | 28.8 | 4.44 × 10$^{-4}$ |
| 0.3 | 3.41 | 23.3 | 7.85 × 10$^{-4}$ |
| 1 | 0.923 | 0.40 | 1.70 × 10$^{-1}$ |

Figure 25:
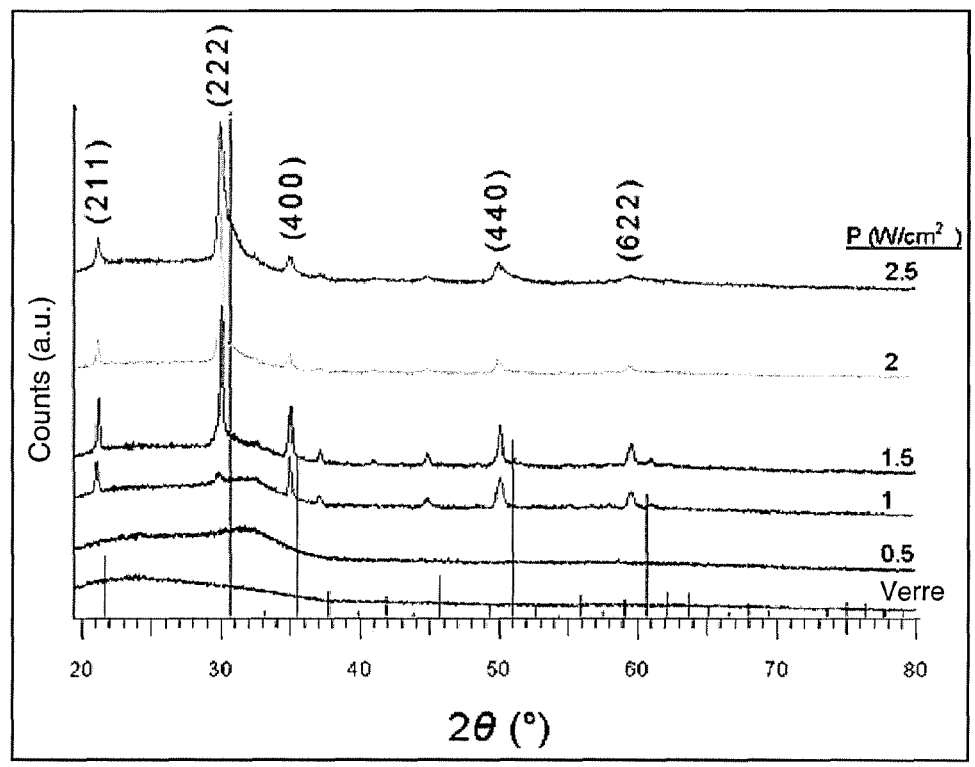
FIG. 25 represents the X-ray diffraction pattern of ITZO thin films on a glass substrate at various power densities, the X-ray diffraction pattern of ITO (reference JCPDS No. 89-4956) being given by way of comparison (vertical lines).

Influence of the sputtering parameters on the structure and morphology—The change in the X-ray diffractograms (FIG. 25) shows that the film deposited at 0.5 W/cm$^2$ has a structure that is amorphous to X-rays, which is attributed to the particles of low energy that arrive at the surface of the substrate. Furthermore, as the RF power density increases (1 and 1.5 W/cm$^2$), particles of higher energy arrive at the substrate and hence lead to a better crystallinity. However, for power densities greater than 1.5 W/cm$^2$, the crystallinity of the film gradually decreases with the power density and broadening of the peak is observed. The disorder associated with higher power densities is probably due to the "back sputtering" phenomenon that induces structural defects in the deposited film. The Zn$^{2+}$ ions may occupy two types of sites (substitutional or interstitial) in the structure, as indicated in the following formula:

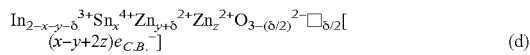

(d)

In order to have a high carrier concentration, it is better to preferably have Zn$^{2+}$ in an interstitial position (z).

In a crystalline structure, Zn$^{2+}$ will preferably occupy the substitutional position for the purpose of minimizing the energy and of reducing the steric effects while the creation of interstitials will be favored in the case of a disordered (amorphous) structure. Furthermore, Park et al. [24] have shown that the existence of Zn in an interstitial position in the structure of In$_2$O$_3$ leads to an increase in the cell parameter. When the positions of the peaks of ITO thin films obtained with such characteristics are compared, a change toward lower angles is always observed, which indicates an increase in the cell parameter. This change is minimized in the case of the better crystallized compound (corresponding to the power of 1.5 W/cm$^2$). Thus, it is possible to expect to have a higher proportion of interstitials in the disordered structure, resulting from a higher carrier concentration. The SEM (scanning electron microscope) photographs prepared at various power densities are presented in FIGS. 26A-C. The film deposited at low power density (0.5 W/cm$^2$) is dense and smooth [FIG. 26A]. However, a continuous change in morphology is observed from the shape of FIG. 26A to that of FIG. 26C when the power density is increased. In FIG. 26C, the presence of grains is clearly visible at the surface with a grain size of ~130 nm. Furthermore, zones (in dark gray) which may correspond to the back sputtering phenomenon are visible.

The surface roughness was also studied using the atomic force microscopy (AFM) technique (FIGS. 27A-C). The ITZO film deposited at 0.5 W/cm$^2$ revealed a very smooth surface, which was in good agreement with the SEM results. However, the surface roughness was improved with the power density due to the crystallization of the film. In fact, for higher deposition powers, a pronounced increase in R$_a$ was found due to the back sputtering phenomenon (Table VII).

Table VII presents: Change in the average surface roughness with power density.

TABLE VII

| Power density (W/cm$^2$) | R$_a$ (nm) |
|---|---|
| 0.5 | 0.24 |
| 1.5 | 0.87 |
| 2.5 | 3.42 |

Optimized sputtering parameters—The preceding results that relate to the influence of the sputtering parameters on the thin films, make it possible to conclude that:

i) the lowest resistivity, in addition to the highest transparency, were observed for the thin film deposited at the power density (P) of 0.5 W/cm$^2$;

ii) the highest transparency was observed for films deposited at p$_{O2}$>0.1%; and iii) the lowest resistivity was obtained for films deposited at p$_{O2}$=0.2%.

Hence, the optimized sputtering conditions for ITZO thin films resulting in high transparency and the lowest resistivity are the following:

P=0.5 W/cm$^2$, p$_{tot}$=1 Pa, p$_{O2}$=0.2% and d$_{t-s}$=7 cm

Specifically, these sputtering parameters result in films with a structure that is amorphous to X-rays where Zn$^{2+}$ preferably occupies the interstitial position improving, in this way, the carrier concentration [43].

ITZO thin films prepared according to the optimal conditions—The optimized sputtering conditions were used to deposit ITZO thin films onto substrates made of glass (ITZO-glass) or of plastic (ITZO-PET). Next, the composition, structure, roughness and also the optical and electrical properties of the thin films were thoroughly studied.

Composition—As is customary, the EPMA (Electron Probe Microanalysis) technique was used to determine the composition of the thin films. The composition of the ITZO thin films deposited under optimized sputtering conditions onto glass or plastic substrates and also the composition of the ceramic target for deposition are indicated in Table VIII. The final composition of the films deposited on the glass or plastic substrates is the same. However, there is a small loss of Sn and Zn compared to the composition of the ceramic target. This difference may be due to the different sputtering yields of the various species present in the target [43].

Table VIII presents the compositions of the ITZO ceramic and thin film determined by the EPMA technique.

TABLE VIII

| Identification of the ceramic and of the thin film | ITZO |
|---|---|
| Final composition of the ceramic ± 0.005 | In$_{1.821}$Sn$_{0.090}$Zn$_{0.098}$O$_{3-\delta}$ |
| Composition of the thin film (on glass) ± 0.005 | In$_{1.838}$Sn$_{0.084}$Zn$_{0.078}$O$_{3-\delta}$ |
| Composition of the thin film (on plastic) ± 0.005 | In$_{1.839}$Sn$_{0.082}$Zn$_{0.079}$O$_{3-\delta}$ |

Figures 28A, 28B:
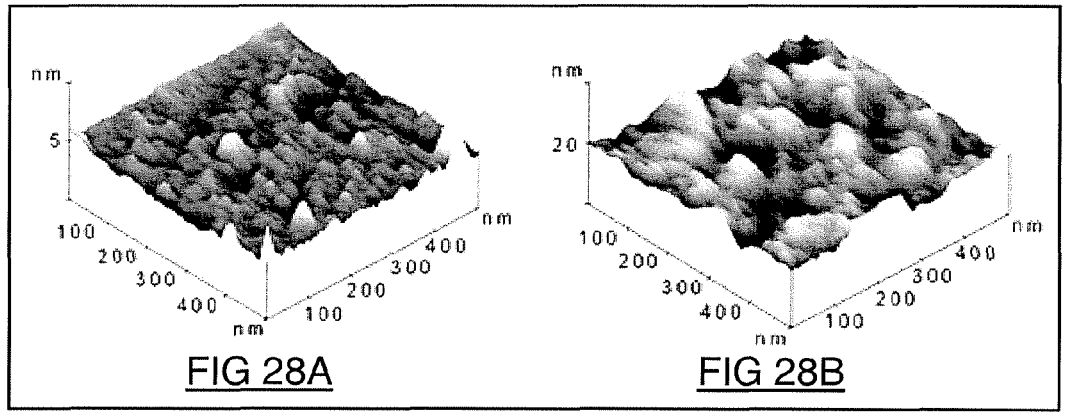
FIGS. 28A and 28B represent the AFM images for the ITO-glass film (FIG. 28A) and the ITZO-PET film (FIG. 28B), at various scales of the z axis.

Morphology and structure—FIGS. 28A and 28B show that the ITZO-PET film has a higher surface roughness (R$_a$=1.46 nm) than the ITZO-glass film (R$_a$=0.24 nm). This is due to the higher roughness of the surface of the initial plastic substrate.

Figure 29:
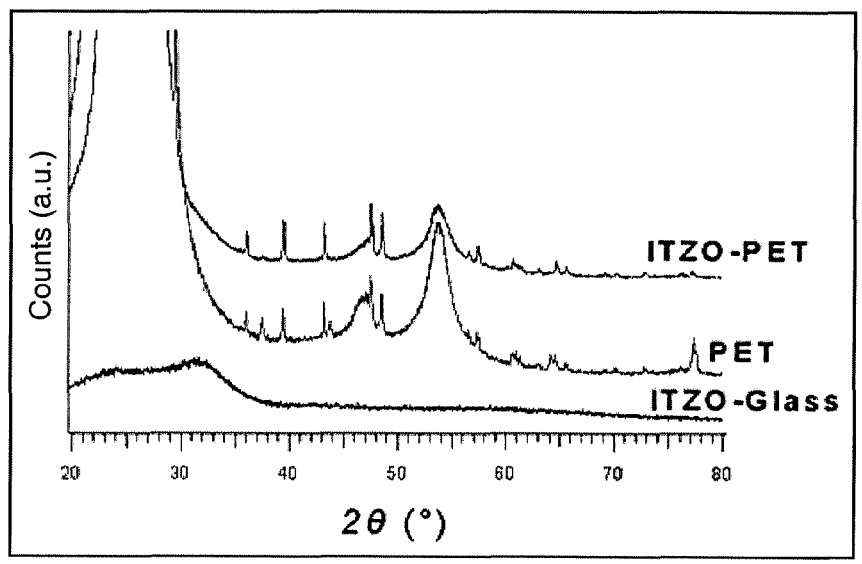
FIG. 29 represents the X-ray diffraction patterns for the ITZO thin films on a glass substrate (ITZO-glass), or on the plastic substrate (ITZO-PET, the X-ray diffraction pattern of the PET substrate being given by way of comparison.

The two films, ITZO-glass and ITZO-PET, display a structure that is amorphous to X-rays (FIG. 29). As has been shown previously, this is due to the deposition of the film which takes place at a low power density (0.5 W/cm$^2$); the peaks observed are characteristic of the plastic substrate (PET).

Figure 30:
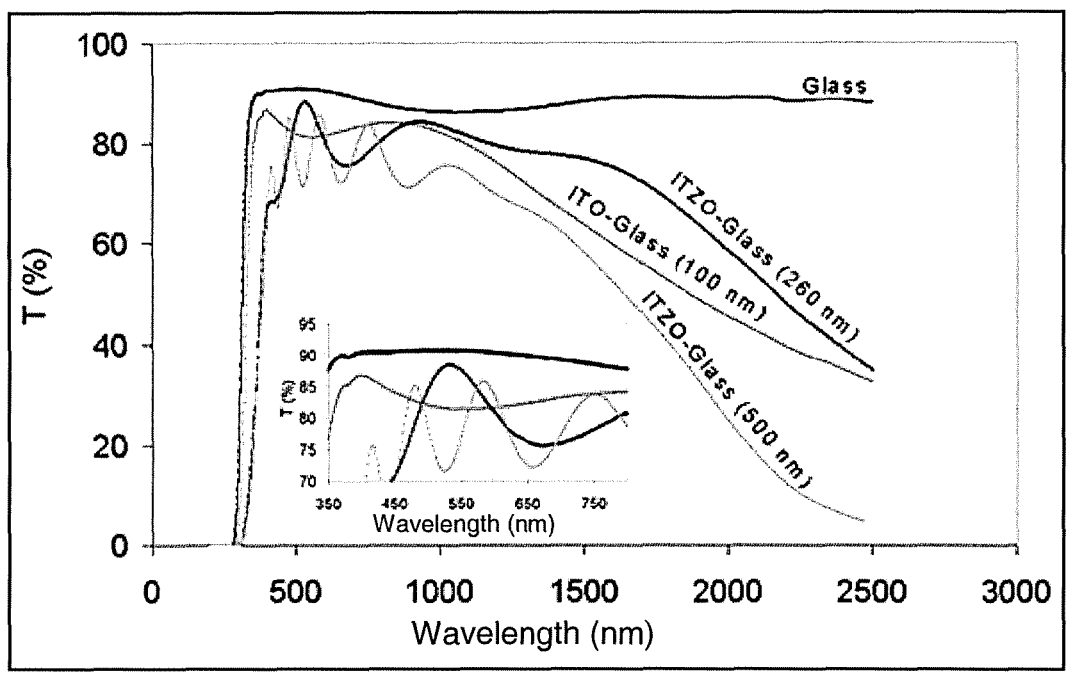
FIG. 30 represents the optical transmission for ITZO-glass thin films which have different thicknesses, the transparency of ITO-glass being given by way of comparison.
Figure 31:
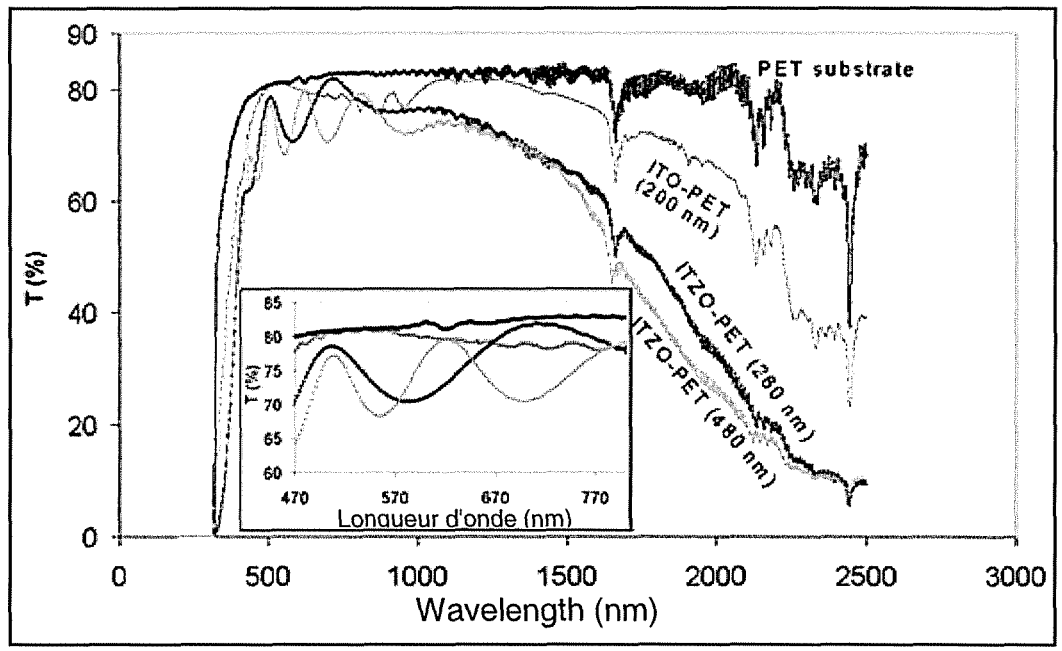
FIG. 31 represents the optical transmission for ITZO-PET thin films which have different thicknesses, the transparency of ITO-PET being given by way of comparison.

Optical properties—The change in the transmittance with the wavelength for the ITZO films deposited on glass and plastic substrates is shown respectively in FIGS. 30 and 31.

For ITZO-glass (insert from FIG. 30), a high transparency (~88.5%) is observed for films which have a thickness of ~260 nm, which is close to the value obtained for the commercial ITO deposited on glass (ITO-glass). However, as expected, the transparency has hardly decreased (~3%) when the thickness of the film increases to ~500 nm. In the case of ITZO-PET films (thickness of 260 nm) (insert from FIG. 31), the transparency is of the same order as that observed for the commercial ITO that is deposited on PET. The transparencies of ~82% and of ~80% are obtained for the ITZO-PET films that respectively have a thickness of ~260 nm and of ~480 nm. Specifically, the transparency values are considered to be very high as regards the transparency of the plastic substrate (PET) (—83%) that obviously limits the transparency of the films.

Figure 32:
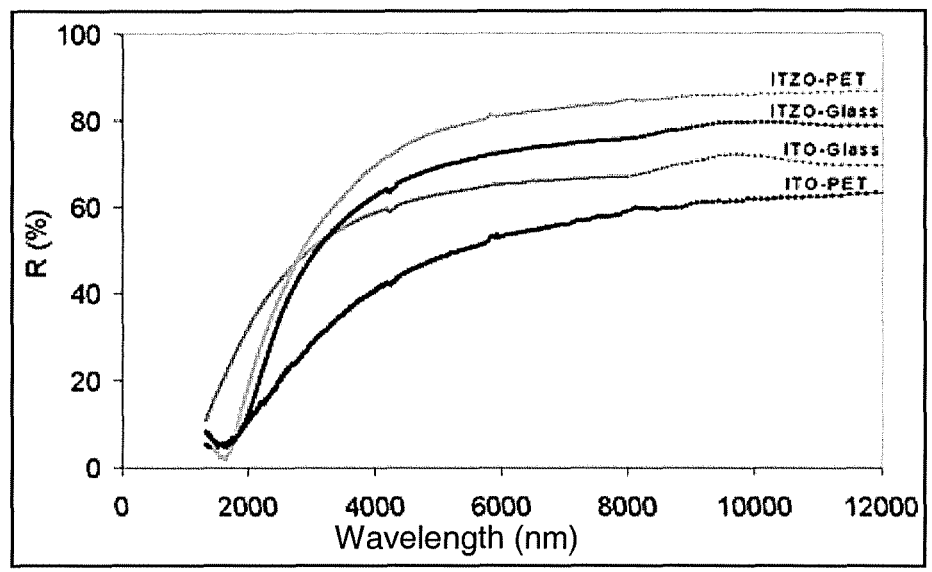
FIG. 32 represents the optical IR reflection for the ITZO thin films deposited on substrates made of glass (ITZO-glass (260 nm)) and made of plastic (ITZO-PET (260 nm)), the reflectivity curves of commercial ITO-glass (100 nm) and ITO-PET (200 nm) being given by way of comparison.

A high IR reflectivity was obtained for both the ITZO-glass and ITZO-PET thin films (FIG. 32). It reaches ~79% for the films deposited on glass, whereas ~87% is achieved for the films deposited on plastic substrates. This is due to the high carrier concentration [as will be shown later on (Table IX)], and hence a higher plasma frequency ($\omega_P$), according to $\omega_p = (Ne^2/\epsilon_0\epsilon_\infty m_{e*})^{1/2}$, which leads to a higher IR reflectivity according to $$R = 1 - \frac{2}{\omega_p \tau \epsilon_\infty^{1/2}}.$$

The ITZO films always have a higher reflectivity in the IR range than commercial ITO films due to the high values of the carrier mobility (Table IX).

Figure 33:
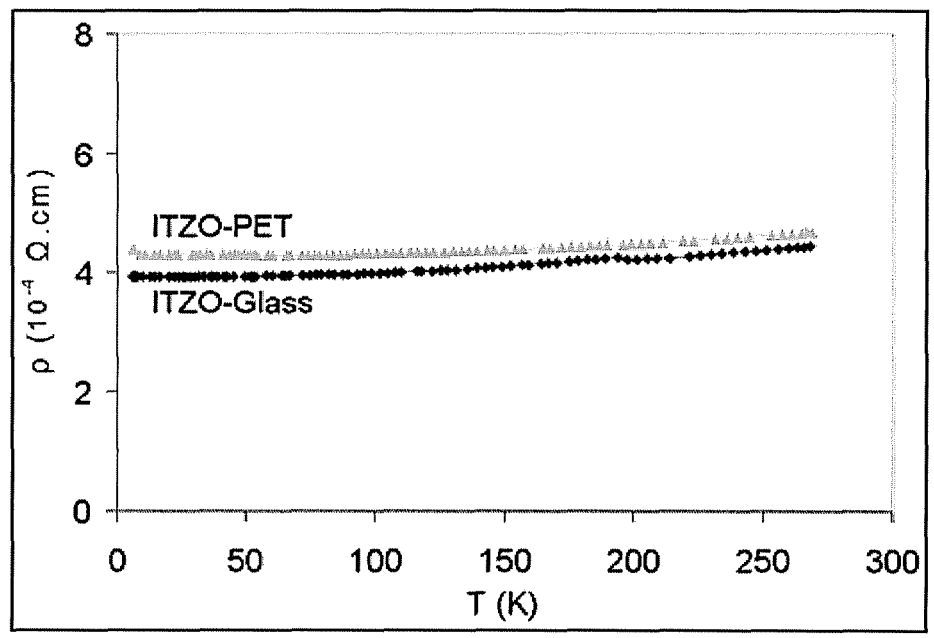
FIG. 33 shows the change in the resistivity with temperature for ITZO thin films deposited on a substrate made of plastic (ITZO-PET) and made of glass (ITZO-glass), the film thickness being 260 nm.

Electrical properties—Although in the presence of a higher carrier concentration for ITZO-PET films than for ITZO-glass films that have the same thickness (Table IX), the resistivity of the ITZO-PET films is barely higher (Table IX and FIG. 33). The same tendency was also observed for the sheet resistance. This behavior is due to the lower carrier mobility for the ITZO-PET thin films.

Table IX presents: Carrier concentration, mobility and resistivity for various thicknesses of ITZO-PET and ITZO-glass. The data for commercial ITO thin films (ITO-PET and ITO-glass) are given by way of comparison.

TABLE IX

| | Thickness (nm) ± 20 | Carrier concentration ($\times 10^{20}$ e$^-$ cm$^{-3}$) ± 5% | Mobility (cm$^2$/V·s) ± 5% | Resistivity ($\times 10^{-4}$ Ω·cm) ± 5% | Sheet resistance (Ω/□) ± 5% |
|---|---|---|---|---|---|
| Sample | | | | | |
| ITZO-PET | 260 | 5.30 | 25.2 | 4.68 | 18.1 |
| ITZO-PET | 480 | 5.41 | 16.2 | 5.62 | 14.0 |
| ITZO-Glass | 260 | 4.89 | 28.8 | 4.44 | 17.2 |
| ITZO-Glass | 500 | 5.04 | 26.5 | 4.67 | 9.1 |
| Commercial | | | | | |
| ITO-PET | 200 | 5.00 | 10.7 | 1.17 | 58.5 |
| ITO-Glass | 100 | 8.43 | 18.6 | 3.99 | 39.9 |

Table IX also shows that the resistivity for the ITZO films (260 nm) deposited on unheated glass and/or on plastic substrates is close to that observed for commercial ITO thin films that have been deposited at ~200° C. on a glass substrate (ITO-glass), this temperature resulting in well crystallized films. The carrier concentration of the ITZO films is lower than that of the ITO-glass films, but they have a higher mobility (Table IX). More advantageously, the ITZO-PET thin films bring out lower resistivities, and consequently lower sheet resistances, than the commercial ITO-PET thin films that have been deposited in a similar manner at ambient temperature. This may be explained by the higher carrier concentration and mainly by the higher carrier mobility that take place in the ITZO-PET films [43].

Conclusions—ITZO thin films, deposited from the optimized ITZO ceramic target, were prepared by RF magnetron sputtering. More advantageously, the ITZO films deposited on PET polymer substrates have greater optoelectronic performances than their commercial ITO homologs. Their amorphous nature permits the fact that $Zn^{2+}$ is in interstitial positions that lead to an increase in the carrier concentration, and consequently in the conductivity. In crystalline ITZO films, $Zn^{2+}$ is in substitutional positions leading to a reduction in the conductivity. This behavior is different from that observed for ITO, for which the conductivity increases when the crystallinity increases. This study shows the advantage of such thin films on plastic substrates.

The optimized sputtering parameters in order to have high optoelectronic performances are the following:
P=0.5 W/cm$^2$, $p_{O2}$=0.2%, $p_{tot}$=1 Pa, and $d_{t-s}$=7 cm The amorphous films obtained on both the glass and plastic substrates have the same chemical composition and they are in good agreement with the composition of the target. A slight loss of Sn and Zn has also been observed in the films due to the different sputtering yields of the various elements present in the target. The morphology of the thin films is dense with a very smooth surface.

In terms of optical properties, the ITZO thin films have brought out a high visible transparency. It is ≥86% for ITZO-glass and ≥80% for ITZO-PET; these values are close to the transmittance value observed for the commercial ITO film. Due to their high carrier mobilities, the resistivity of the ITZO films, deposited on a glass or plastic substrate, is as low as that observed for commercial ITO-glass. The lowest resistivity value reached ~4.4×10$^{-4}$ Ω·cm for ITZO-glass, whereas it reached ~4.7×10$^{-4}$ Ω·cm for ITZO-PET. Advantageously, the ITZO thin films have lower resistivities, and consequently lower sheet resistances, than the commercial ITO-PET thin films, due to the higher carrier concentration and mainly to the higher carrier mobility of the ITZO-PET films. Furthermore, the IR reflectivity of the ITZO films is always higher than that observed for the commercial ITO films due to the higher carrier mobility that occurs in ITZO.

Since the ITZO thin films deposited on plastic substrates (ITZO-PET) have higher performances than their commercial ITO homologs (ITO-PET), these are good candidates for polymer-based optoelectronic devices, such as flexible ECDs (Electrochromic devices), OLEDs, flexible solar cells, etc.

Particular advantages of the process and of the ceramics thus obtained—The process makes it possible to obtain ceramics with high densities (greater than or equal to 90%, and preferably of around 91%). They can, therefore, advantageously be used on an industrial scale (and a fortiori in the laboratory) as a target for DC sputtering (in the case of conductive ceramics such as ITZO of $In_{1.805}Sn_{0.095}Zn_{0.10}O_3$ composition) or RF sputtering (in the case of insulating ceramics such as Zn-doped $Li_4Ti_5O_{12}$ of $Li_4Ti_{4.70}Zn_{0.30}O_{11.7}$ composition). The process has one very important advantage in the sense that the steps of "hot-pressing" or of pressing at ambient temperature (of the order of one tonne per cm$^2$) used to date for producing industrial or laboratory ceramics are avoided here. Therefore with this process there is a significant gain in terms of preparation time (divided by at least a factor of 3) and therefore of personnel cost.

With this process there is also a significant financial gain in terms of equipment cost, since here there is no longer any need for the industrial hot-pressing equipment which is expensive and difficult to maintain; the same applies for the ambient-temperature pressing equipment. Furthermore, although the ceramics proposed here are slightly less dense than the industrial ceramics (the latter often being very close to the theoretical density, that is to say greater than or equal to 95%), their density, of around 90%, or even slightly higher, is amply sufficient in order to be able to be used as targets for sputtering, as emphasized above.

Furthermore, in the case of the conductive ceramics of the invention, the electrical conductivity advantageously remains very high, despite a slightly lower density, that has also been reported.

It has furthermore been demonstrated that the conductivity of the aforementioned ITZO ceramics is slightly greater than those of the ITO ceramics commonly used.

As regards the electrical resistivity of the ITZO ceramics, it has surprisingly been discovered that these ceramics possess low electrical resistivities in comparison with that of ITO. It gradually decreases with the Zn content and reaches its minimum for ceramics that nominally contain 10 mol % of Zn. This is partially due to the difference in the density of the ceramic. The lowest resistivity was observed for the ceramic having the highest density. The charge concentration decreases with the Zn content in the ceramic. This can be explained by the increase in the substitution of In$^{3+}$ by Zn$^{2+}$ in the In$_2$O$_3$ structure.

As regards the charge mobility, it has surprisingly been discovered that a significant increase in the mobility is associated with a high increase in grain percolation. A low mobility is obtained for ceramics having a semiconductor behavior, whereas a high mobility is observed for ceramics having a metallic behavior.

The highest density (around 93% of the theoretical density) is observed for ceramics having the nominal composition [In$_2$O$_3$:Sn$_{0.10}$]:Zn$_{0.10}$.

Surprisingly, the ITZO ceramic resistivities are lower than those of ITO, due to a higher density and a lower porosity and due to a greater mobility.

The X-ray diffraction pattern for the ITZO powders sintered (annealed according to GDT) at 1300° C. (FIG. 5) shows that they are very well crystallized and that they adopt the bixbyite structure of ITO. No supplementary peak corresponding to the ZnO$_x$ or Zn$_k$In$_2$O$_{3+k}$ structures has been observed when the Zn content is increased to a concentration of 10 mol %.

REFERENCES

[1] J. I. Hamberg, C. G. Granqvist, J. Appl. Phys. 60 (1986) R123.

[2] C. G. Granqvist, Appl. Phys. A 52 (1991) 83.

[3] C. G. Granqvist, A. Hultaker, Thin Solid Films 411 (2002) 1.

[4] J. M. Phillips, R. J. Cava, G. A. Thomas, S. A. Carter, J. Kwo, T. Siegrist, J. J. Krajewski, J. H. Marshall, W. F. Peck, Jr., D. H. Rapkine, Appl. Phys. Lett. 67 (1995) 2246.

[5] B. G. Lewis, D. C. Paine, MRS Bull. 25 (2000) 22.

[6] A. J. Freeman, K. R. Poeppelmeier, T. O. Mason, R. P. H. Chang, T. J. Marks, MRS Bull. 25 (2000) 45.

[7] R. Wang, L. L. H. King, A. W. Sleight, J. Mater. Res. 11 (1996) 1659.

[8] C. Ktlic, A. Zunger, Phys. Rev. Lett. 88 (2002) 95501.

[9] K. Nomura, H. Ohta, K. Ueda, T. Kamiya, M. Hirano, H. Hosono, Science 300 (2003) 1269.

[10] B. Yaglioglu, Y. Huang, Hy. Y. Yeom, D. C. Paine, Thin Solid Films 496 (2006) 89.

[11] J. C. C. Fan, J. B. Goodenough, J. Appl. Phys. 48 (1977) 3524.

[12] E. Fortunato, A. Pimentel, A. Gonçalves, A, Marques, R. Martins, Thin Solid Films 502 (2006) 104.

[13] T. Minami, T, Kakumu, Y. Takeda, S. Takata, Thin Solid Films 290-291 (1996) 1,

[14] N. Naghavi, A. Rougier, C. Marcel, C. Guéry, J. B. Leriche, J. M. Tarascon, Thin Solid Films 360 (2000) 233.

[15] N. Naghavi, C. Marcel, L. Dupont, A. Rougier, J. B. Leriche, C. Guéry, J. Mater. Chem. 10 (2000) 2315.

[16] N. Naghavi, C. Marcel, L. Dupont, C. Guéry, C. Maugy, J. M. Tarascon, Thin Solid Films 419 (2002) 160.

[17] T. Sasabayashi, N. Ito, E. Nishimura, M. Kon, P. K. Song, K. Utsumi, A. Kaijo, Y. Shigesato, Thin Solid Films 445 (2003) 219.

[18] Y. S. Jung, J. Y. Seo, D. W. Lee, D. Y. Jeon, Thin Solid Films 445 (2003) 63.

[19] N. Ito, Y. Sato, P. K. Song, A. Kaijio, K. Inoue, Y. Shigesato, Thin Solid Films 496 (2006) 99.

[20] D. Y. Ku, i. H. Kim, i. Lee, K. S. Lee, T. S. Lee, J. H. Jeong, B. Cheong, Y. J. Baik, W. M. Kim, Thin Solid Films 515 (2006) 1364.

[21] T. Minami, T. Kakumu, S. Takata, J. Vac. Sci. Technol., A 14 (3) (1996) 1704.

[22] N. Naghavi, L. Dupont, C. Marcel, C. Maugy, B. Laïk, A. Rougier, C. Guéry, J. M. Tarascon, Electrochim. Acta 46 (2001) 2007.

[23] T. Moriga, D. D. Edwards, T. O. Mason, J. Am. Ceram. Soc. 81 (1998) 1310.

[24] D. H. Park, K. Y. Son, J. H. Lee, J. J. Kim, J. S. Lee, Solid State Ionics 172 (2004) 431.

[25] G. B. Palmer, K. R. Poeppelmeier, T. O. Mason, Chem. Mater. 9 (1997) 3121.

[26] A. Ambrosini, G. B. Palmer, A. Maignan, K. R. Poeppelmeier, M. A. Lane, P. Brazis, C. R. Kannewurf, T. Hogan, T. O. Mason, Chem. Mater. 14 (2002) 52.

[27] A. Ambrosini, S. Malo, K. R. Poeppelmeier, M. A. Lane, C. R. Kannewurf, T. O. Mason, Chem. Mater. 14 (2002) 58.

[28] T. Minami, T. Kakumu, K. Shimokawa, S. Takata, Thin Solid Films 317 (1998) 318.

[29] T. Minami, T. Yamamoto, Y. Toda, T. Miyata, Thin Solid Films 373 (2000) 189.

[30] H. M. Ali, phys. stat. sol. a 202 (2005) 2742.

[31] M. Russak, J. De Carlo, J. Vac. Sci. Technol. 1 (1983) 1563.

[32] H. Kim A. Piqué, J. S. Horwitz, H. Mattoussi, H. Murata, Z. H. Kafafi, D. B. Chrisey, Appl. Phys. Lett. 74 (1999) 3444.

[33] T. O. Mason, a G. B. Gonza'lez, a J.-H. Hwangb, D. R. Kammler, Phys. Chem. Chem. Phys. 5 (2003) 2183.

[34] H. Kim, C. M. Gilmore, J. Appl. Phys. 86 (1999) 6451.

[35] H. Enoki, J. Echogoya, H. suto, J. Mater. Sci. 26 (1991) 4110.

[36] I. Saadeddin, B. Pecquenard, G. Campet, "Zn and Sn doped In2O3 ceramics: structural and electrical characterization", to be published.

[37] Canadian patent application no. 2,547,091 (priority of this application)

[38] I. Saadeddin, H. S. Hilal, B. Pecquenard, J. Marcus, A. Mansouri, C. Labrugere, M. A. Subramanian, G. Campet, Solid state Sci. 8 (2006) 7.
[39] M. Marezio, Acta Cryst. 20 (1966) 723.
[40] J. H. W. De Witt, J. Solid State Chem. 20 (1977) 143.
[41] R D. Shannon, Acta Cryst. A 32 (1976) 751.
[42] C. Marcel, Ph.D. thesis, Bordeaux 1 University, Bordeaux, France (1998).
[43] I. Saadeddin, B. Pecquenard, J. P. Manaud, G. Campet, "Synthesis and characterization of Zn and Sn doped In2O3 thin films deposited on glass and plastic PET substrates" to be published.
[44] E. Burstein, Phys. Rev. 93 (1954) 632.
[45] T. S. Moss, Proc. Phys. Soc. London Sect. B 67 (1954) 775.

Although the present invention has been described using specific implementations, it is understood that several variations and modifications may be grafted to said implementations, and the present invention aims to cover such modifications, uses or adaptations of the present invention that in general follow the principles of the invention and that include any variation of the present description which will become known or conventional in the field of activity in which the present invention lies.

The invention claimed is:

1. A process for preparing a ceramic made of an inorganic base material doped by an inorganic dopant material comprising a dopant element J, said ceramic being represented by the formula (I) $E_{a-x'}^{k}J_{x'}^{m}O_{\beta-x'(k-m)/2}^{2-}\square_{x'(k-m)/2}$ wherein:
    $E_\alpha^k O_\beta^{2-}$ denotes the inorganic base material:
    E denotes at least one metal from groups I to VIII of the Periodic Table of the Elements, and k denotes the average degree of oxidation of E in the formula I;
    J denotes at least one metal from groups I to VIII of the Periodic Table of the Elements, and m denotes the average degree of oxidation of the element J, m<k;
    α, k and β are positive numbers being between 1 and 20, such that αk−2β=0;
    x' denotes a positive integer such that x'<α; and
    $\square$ represents an anionic vacancy;
said process comprising:
    a step of mixing the inorganic base material in powder form with the inorganic dopant material in powder form; and
    a sintering step carried out at a temperature above 800° C., wherein the forces exerted on the powders, after the mixing step and before the sintering step, are less than or equal to 5 kg/cm².

2. The process according to claim 1, wherein the inorganic base material is:
    the formula $E_\alpha^k O_\beta^{2-}$ wherein E represents at least one metal selected from the group consisting of Fe, Cu, Co, W, Mo, Ti, Cr, Sn and In.

3. The process according to claim 1, wherein the inorganic dopant material contains one or more cations having a degree of oxidation lower than that of the cation(s) of the inorganic base material.

4. The process according to claim 1, wherein a molar ratio of the inorganic dopant material and the inorganic base material varies between 0.001 and 0.4.

5. The process according to claim 1, wherein the sintering step is carried out at a temperature between 800° C. and 1700° C. for a time period between 1 and 100 hours, at ambient atmosphere or under an inert atmosphere.

6. The process according to claim 1, wherein the inorganic base material is selected from the group consisting of oxides, oxyhalides, and mixtures thereof.

7. The process according to claim 6, wherein the oxides are selected from the group consisting of $TiO_2$, $SnO_2$, $In_2O_3$, $Li_4Ti_5O_{12}$, $MoO_3$, $WO_3$, $Cr_2O_3$, $Fe_2O_3$, $Li_xNiO_2$ with x being between 0.1 and 2, $Li_xCrO_{2.5}$ with x being between 1 and 2, $LiFeO_2$ and mixtures thereof.

8. The process according to claim 1, wherein a pair of the inorganic base material and the inorganic dopant material is selected as follows:
    the inorganic base material having a cation $W^{6+}$ or $Mo^{6+}$ associated with the inorganic dopant material having at least one cation J selected from the group consisting of $Nb^{5+}$, $Ta^{5+}$, $V^{5+}$, $Ti^{4+}$, $Sn^{4+}$, $Mn^{4+}$, $Mg^{2+}$, $Zn^{2+}$, $Ni^{3+}$, $Ni^{2+}$, $Cu^{2+}$, $Co^{3+}$, $Co^{2+}$, $Fe^{3+}$, $Cr^{3+}$ and $Mn^{3+}$;
    the inorganic base material having a cation $V^5$, $Nb^{5+}$ or $Ta^{5+}$ associated with the inorganic dopant material having at least one cation J selected from the group consisting of $Ti^{4+}$, $Sn^{4+}$, $Mn^{4+}$, $Ni^{3+}$, $Co^{3+}$, $Fe^{3+}$, $Cr^{3+}$, $Mn^{3+}$, $Zn^{2+}$, $Mg^{2+}$, $Ni^{2+}$, $Cu^{2+}$ and $Co^{2+}$;
    the inorganic base material having a cation $Mn^{3+}$, $Co^{3+}$ or $In^{3+}$ associated with the inorganic dopant material having at least one cation J selected from the group consisting of $Zn^{2+}$, $Mg^{2+}$, $Cu^{2+}$, $Co^{2+}$, $Mn^{2+}$ and $Fe^{2+}$, provided that Sn can be associated to J when the cation of the inorganic base material is $In^{3+}$; or
    the inorganic base material having a cation $Co^{2+}$, $Fe^{2+}$, $Mg^{2+}$, $Cu^{2+}$, $Ni^{2+}$ and $Mn^{2+}$ associated with the inorganic dopant material having at least one cation $Li^+$ as cation J.

9. The process according to claim 1, wherein the mixing of the powders of the inorganic base material and the inorganic dopant material is carried out in presence of an organic or aqueous solvent or a mixture of at least one organic solvent and one aqueous solvent.

10. The process according to claim 9, wherein the organic solvent is selected from the group consisting of alcohols, ketones, ethers and mixtures thereof.

11. The process according to claim 1, wherein, during the step of mixing, a mixture containing 82.23 mol. % of $In_2O_3$ as the inorganic base material, and 8.66 mol. % of $SnO_2$ and 9.11 mol. % of ZnO as the inorganic dopant material, is prepared.

12. The process according to claim 1, wherein the resistivity of the ceramic obtained is adjusted by controlling an amount of the inorganic dopant material in the mixture of powders subjected to the sintering, implying that an increase of the amount of the inorganic dopant material promotes a decrease of the resistivity.

13. The process according to claim 12, for obtention of a ceramic having a resistivity below or equal to around 1.7×10⁻³ Ω·cm, wherein
    the inorganic dopant material comprising the dopant element J is selected from the group consisting of $Zn^{2+}$, $Mg^{2+}$, $Cu^{2+}$, $Co^{2+}$, $Mn^{2+}$ and $Fe^{2+}$; and
    an amount of the inorganic dopant material in the mixture of the inorganic base material and the inorganic dopant material is above or equal to 10 mol. %.

14. The process according to claim 1, wherein the charge mobility of the ceramic obtained is adjusted by controlling an amount of the inorganic dopant material in the mixture of powders subjected to the sintering, implying that an increase of the amount of the inorganic dopant material promotes an increase of the charge mobility of the ceramic.

15. The process according to claim 1, wherein the forces exerted on the powders, after the mixing step and before the sintering step, are less than or equal to 1 kg/cm².

* * * * *